United States Patent
Hasegawa et al.

(10) Patent No.: US 7,268,983 B2
(45) Date of Patent: Sep. 11, 2007

(54) MAGNETIC SENSING DEVICE WITH MULTILAYERED PINNED MAGNETIC LAYER HAVING MAGNETOSTRICTION-ENHANCING LAYER

(75) Inventors: Naoya Hasegawa, Niigata-ken (JP); Masamichi Saito, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 313 days.

(21) Appl. No.: 11/156,678

(22) Filed: Jun. 20, 2005

(65) Prior Publication Data

US 2005/0280954 A1    Dec. 22, 2005

(30) Foreign Application Priority Data

Jun. 21, 2004 (JP) ............................ 2004-182289

(51) Int. Cl.
*G11B 5/33* (2006.01)
(52) U.S. Cl. ................................. 360/324.11
(58) Field of Classification Search .......... 360/324.11, 360/324.1
See application file for complete search history.

(56) References Cited

U.S. PATENT DOCUMENTS

| | | | |
|---|---|---|---|
| 5,583,725 A | | 12/1996 | Coffey et al. |
| 5,648,885 A | * | 7/1997 | Nishioka et al. ....... 360/324.12 |
| 6,256,222 B1 | * | 7/2001 | Sakakima et al. .......... 365/158 |
| 7,045,224 B2 | * | 5/2006 | Hasegawa et al. ....... 428/811.5 |
| 7,126,797 B2 | * | 10/2006 | Hasegawa et al. ....... 360/324.1 |
| 7,220,499 B2 | * | 5/2007 | Saito et al. .............. 428/811.5 |

FOREIGN PATENT DOCUMENTS

| | | |
|---|---|---|
| JP | 2002-092826 | 3/2002 |
| JP | 2002-150512 | 5/2002 |
| JP | 2002-319112 | 10/2002 |
| JP | 2003-031867 | 1/2003 |

\* cited by examiner

*Primary Examiner*—Angel Castro
(74) *Attorney, Agent, or Firm*—Brinks Hofer Gilson & Lione

(57) ABSTRACT

A magnetic sensing device is presented that has a multilayer material with a pinned magnetic layer, a nonmagnetic material layer, and a free magnetic layer. The pinned magnetic layer is a composite with a nonmagnetic intermediate layer and magnetic thin-film layers separated from each other by the nonmagnetic intermediate layer. A first nonmagnetic magnetostriction-enhancing layer is on the pinned magnetic layer and contacts a first thin-film layer placed farthest from the nonmagnetic material layer. At least one of the magnetic thin-film layers has a composite structure with a second nonmagnetic magnetostriction-enhancing layer and magnetic layers separated from each other by the second magnetostriction-enhancing layer. All of the magnetic layers are magnetized in the same direction antiparallel to the adjacent magnetic thin-film layer. At least some crystals of the first and second magnetostriction-enhancing layers and the first thin-film layer/magnetic layers are epitaxial or heteroepitaxial.

13 Claims, 9 Drawing Sheets

US 7,268,983 B2

MAGNETIC SENSING DEVICE WITH MULTILAYERED PINNED MAGNETIC LAYER HAVING MAGNETOSTRICTION-ENHANCING LAYER

This application claims the benefit of priority to Japanese Patent Application No. 2004-182289, filed on Jun. 21, 2004, herein incorporated by reference.

BACKGROUND OF THE INVENTION

1. Field of the Invention

The present invention relates to magnetic sensing devices which can strongly pin magnetization of pinned magnetic layers by uniaxial anisotropy of the pinned magnetic layers themselves.

2. Description of the Related Art

Magnetic sensing devices including multilayer materials each formed by laminating a free magnetic layer, a nonmagnetic material layer, and a pinned magnetic layer are classified into two types depending on the current direction with respect to the multilayer materials; i.e. a current-in-the-plane (CIP) type and a current-perpendicular-to-the-plane (CPP) type.

In the CIP-type magnetic sensing devices, current is applied to the multilayer materials in the direction parallel to the film surfaces. On the other hand, in the CPP-type magnetic sensing devices, current is applied in the direction perpendicular to the film surfaces of the multilayer materials.

The CPP-type magnetic sensing devices are assumed to be advantageous compared with the CIP-type magnetic sensing devices, because the CPP-type magnetic sensing devices can magnify reproduced outputs regardless of their reduced device sizes. Nowadays, the CPP-type magnetic sensing devices are expected to have a structure capable of responding to an increasing high recording density as a replacement of the CIP-type magnetic sensing devices, which are the current mainstream of the magnetic sensing devices.

Japanese Unexamined Patent Application Publication No. 2002-150512 (referred to as Patent Document 1 hereinafter) discloses a CPP-type magnetic sensing device, in particular, a structure enhancing spin-dependent scattering of conduction electrons and improving the sensitivity by forming a free magnetic layer or a pinned magnetic layer having a composite of a plurality of thin films and nonmagnetic layers alternately laminated.

Japanese Unexamined Patent Application Publication No. 8-7235 (referred to as Patent Document 2 hereinafter) discloses a system for pinning magnetization of a pinned magnetic layer by uniaxial anisotropy of the pinned magnetic layer itself.

In conventional magnetic sensing devices, the presence of very thick antiferromagnetic layers causes disadvantages, such as a decrease in a giant magnetoresistive (GMR) effect. The disadvantages in the decrease in the GMR effect will now be described referring to the CPP-type magnetic sensing device.

FIG. 13 schematically shows a structure of the conventional CPP-type magnetic sensing device. Specifically, the device has a multilayer material including a free magnetic layer 1, nonmagnetic material layers 2 on the top and bottom of the free magnetic layer 1, pinned magnetic layers 3 on both of the nonmagnetic material layers 2 so as to sandwich the free magnetic layer 1 and the nonmagnetic material layers 2, and antiferromagnetic layers 4 on both of the pinned magnetic layers 3. Electrodes 5 and 6 are further provided on the top and bottom of the multilayer material.

In the structure shown in FIG. 13, the pinned magnetic layers 3 each include a three-layer composite having two magnetic layers 3a and 3c and a nonmagnetic intermediate layer 3b disposed between the magnetic layers 3a and 3c. Magnetization of the magnetic layers 3a and 3c is antiparallel to each other. Such a composite is called an artificial ferri-structure.

For example, the free magnetic layer 1 is made of a Ni—Fe based alloy, the nonmagnetic material layers 2 are made of Cu, the magnetic layers 3a and 3c of the pinned magnetic layers 3 are made of a Co—Fe based alloy, the nonmagnetic intermediate layers 3b of the pinned magnetic layers 3 are made of Ru, and the antiferromagnetic layers 4 are made of a Pt—Mn alloy.

In the structure shown in FIG. 13, since the antiferromagnetic layers 4 have a high resistivity, e.g. a resistivity of about 200 $\mu\Omega \cdot cm^2$ (or more), the antiferromagnetic layers 4 generate Joule heat when a current is applied between the electrodes 5 and 6. As Joule heat is generated in the antiferromagnetic layers 4, phonon scattering and electromigration caused by lattice vibration of conduction electrons are intensified in the adjoining pinned magnetic layers 3, the nonmagnetic material layers 2, and the free magnetic layer 1.

It is assumed that a resistance change per unit area ($\Delta R \cdot A$) of the CPP-type magnetic sensing device is closely connected to the effect of spin-dependent bulk scattering. In the structure shown in FIG. 13, the change in resistance ($\Delta R$) is affected by the free magnetic layer 1 and the magnetic layers 3c, which are in contact with the nonmagnetic material layers 2, of the pinned magnetic layers 3. In particular, the magnetic layers 3c must have a positive coefficient of spin-dependent bulk scattering ($\beta$ value) in order to allow up-spin conduction electrons to flow in the magnetic layers 3c and to allow down-spin conduction electrons to be scattered in the magnetic layers 3c. This increases differential spin-diffusion length between the up-spin conduction electrons and the down-spin conduction electrons, resulting in an increase of the resistance change per unit area ($\Delta R \cdot A$).

However, the above-mentioned phonon scattering by lattice vibration of the conduction electrons generates spin-independent scattering of the conduction electrons. As a result, the CPP-type magnetic sensing device cannot be sufficiently improved in the GMR effect which is typified by a resistance change per unit area ($\Delta R \cdot A$).

In the structure shown in FIG. 13, since the antiferromagnetic layers 4 are thick, the distance between the electrodes 5 and 6 is large. Therefore, the structure cannot appropriately respond to the increasing recording density of recording media.

These problems similarly occur in the magnetic sensing device disclosed in Patent Document 1 because the antiferromagnetic layer is basically included in the film configuration of the device.

The GMR effect can be sufficiently improved by removing the antiferromagnetic layers 4 from the multilayered structure. In such a structure, magnetization of the pinned magnetic layers must be sufficiently pinned by a means other than the antiferromagnetic layers 4.

With reference to Patent Document 2, magnetization of the pinned magnetic layers is pinned by uniaxial anisotropy of the pinned magnetic layers themselves, instead of disposing the antiferromagnetic layers.

In the structure disclosed in Patent Document 2, a pinned ferromagnetic layer (pinned magnetic layer) is laminated on a buffer layer that is made of Ta and functions as a base material. Ta tends to be amorphous and has a high resistivity. Therefore, when this structure is applied to a CPP-type magnetic sensing device, the buffer layer generates heat in the similar manner to the conventional antiferromagnetic layer and spin-independent scattering of the conduction electrons occurs. Consequently, it is assumed that the GMR effect cannot be sufficiently improved. Furthermore, Patent Document 2 does not sufficiently disclose how magnetization of the pinned ferromagnetic layer is strongly pinned by using the buffer layer made of Ta.

In Patent Document 2, though a first ferromagnetic film is distant from the buffer layer, "self pinning" of the first ferromagnetic film is not performed. Furthermore, in Patent Document 2, the magnetization of the first ferromagnetic film and a second ferromagnetic film is antiparallel to each other and in an unstable state to the outer magnetic field.

However, any modification of an interface structure between the first ferromagnetic film and a spacer layer made of Cu should be avoided because such modification causes a decrease in the GMR effect. Therefore, the issue for strongly pinning magnetization of the first ferromagnetic film cannot be solved.

SUMMARY OF THE INVENTION

Accordingly, it is an object of the present invention to solve the above-mentioned problems and to provide a magnetic sensing device totally enhancing magnetostriction of a plurality of thin-film layers constituting a pinned magnetic layer and strongly pinning the pinned magnetic layer.

The present invention relates to a magnetic sensing device including a multilayer material having a pinned magnetic layer, a nonmagnetic material layer, and a free magnetic layer.

The pinned magnetic layer is a composite including a nonmagnetic intermediate layer and a plurality of magnetic thin-film layers disposed so as to be separated from each other by the nonmagnetic intermediate layer.

A first magnetostriction-enhancing layer made of a nonmagnetic metal is disposed on the pinned magnetic layer so as to be contact with a first thin-film layer placed farthest from the nonmagnetic material layer.

At least one of the magnetic thin-film layers has a composite structure including a second magnetostriction-enhancing layer made of a nonmagnetic metal and a plurality of magnetic layers disposed so as to be separated from each other by the second magnetostriction-enhancing layer.

All of the magnetic layers are magnetized in the same direction antiparallel to the adjacent magnetic thin-film layer separated by the nonmagnetic intermediate layer.

At least some crystals of the first magnetostriction-enhancing layer and the first thin-film layer are epitaxial or heteroepitaxial and at least some crystals of the second magnetostriction-enhancing layer and the magnetic layers are epitaxial or heteroepitaxial. The pinned magnetic layer has an open end face facing a recording medium.

The present invention can be applied to both of the CIP-type and CPP-type magnetic sensing devices.

The present invention relates to a so-called self-pinning magnetic sensing device that pins magnetization of a pinned magnetic layer by uniaxial anisotropy of the pinned magnetic layer itself.

Magnetic anisotropy field of a ferromagnetic film is determined by crystalline magnetic anisotropy, induced magnetic anisotropy, and magnetoelastic effect. The present invention is completed by focusing on the magnetoelastic effect that determines the uniaxial anisotropy for pinning magnetization of the pinned magnetic layer.

The magnetoelastic effect is controlled by magnetoelastic energy. The magnetoelastic energy is defined by stress applied to the pinned magnetic layer and a magnetostriction constant $\lambda s$ of the pinned magnetic layer.

In the present invention, since the pinned magnetic layer has an open end face facing a recording medium, symmetry of the stress is broken and a tensile stress is applied to the pinned magnetic layer in the height direction (in the normal direction with respect to the facing face) of the device. In the present invention, the magnetoelastic energy is amplified by increasing a magnetostriction constant $\lambda s$ of the pinned magnetic layer. This increases the uniaxial anisotropy of the pinned magnetic layer. By increasing the uniaxial anisotropy of the pinned magnetic layer, magnetization of the pinned magnetic layer is strongly pinned in a certain direction. Consequently, the output of the magnetic sensing device is increased and is improved in stability and symmetry.

The pinned magnetic layer according to the present invention has an artificial ferri-structure including a nonmagnetic intermediate layer and a plurality of magnetic thin-film layers disposed so as to be separated from each other by the nonmagnetic intermediate layer. Each magnetic thin-film layer may be a single magnetic layer or a plurality of magnetic layers laminated directly or indirectly.

The first magnetostriction-enhancing layer made of a nonmagnetic metal is disposed on the pinned magnetic layer to be in contact with the first thin-film layer that is placed farthest from the nonmagnetic material layer. The first thin-film layer and the first magnetostriction-enhancing layer are connected to each other in an epitaxial or heteroepitaxial state. Therefore, the crystalline structure of the first thin-film layer is distorted to increase a magnetostriction constant $\lambda s$ of the first thin-film layer. Thus, the magnetostriction constant $\lambda s$ of the first thin-film layer can be increased.

In the present invention, at least one of the magnetic thin-film layers has a composite structure including the second magnetostriction-enhancing layer made of a nonmagnetic metal and the plurality of magnetic layers disposed so as to be separated from each other by the second magnetostriction-enhancing layer.

The magnetic layers and the second magnetostriction-enhancing layer are connected to each other in an epitaxial or heteroepitaxial state. Thus, the crystalline structure of each magnetic layer is distorted to increase a magnetostriction constant $\lambda s$ of the entire magnetic thin-film layer.

In the present invention, a magnetostriction constant of the first thin-film layer is enhanced from the outside by utilizing the first magnetostriction-enhancing layer. At the same time, a magnetostriction constant of the magnetic thin-film layers is enhanced from the inside by disposing the second magnetostriction-enhancing layer in at least one of the magnetic thin-film layers constituting the pinned magnetic layer. With such a structure, a magnetostriction constant of the entire pinned magnetic layer can be sufficiently enhanced. In particular, in the present invention, since the second magnetostriction-enhancing layer is disposed within the magnetic thin-film layer, the interface structure between the nonmagnetic material layer and the pinned magnetic layer is the same as that of a conventional device. Therefore, the pinned magnetic layer can be sufficiently magnetized and the resulting magnetization can be strongly pinned while a decrease in the GMR effect is avoided.

With a structure that the second magnetostriction-enhancing layer is disposed within the magnetic thin-film layer, a magnetic coercive force of the magnetic thin-film layer can be increased by the effects of interface anisotropy and mutual diffusion at the interfaces.

As a result, magnetization of the pinned magnetic layer is more effectively pinned in the height direction. Therefore, distortion and asymmetry of reproduced waveforms, caused by disordered magnetization of the pinned magnetic layer by a longitudinal bias magnetic field from hard bias layers, are decreased; inversion of the pinned magnetic layer caused by mechanical stress or the like can be prevented; and stable magnetization of the pinned magnetic layer can be also maintained regardless of a change in stress. Thus, the magnetic sensing device having a high reliability can be provided.

In the present invention, preferably, a second thin-film layer, which is one of the magnetic thin-film layers and is disposed closest to the nonmagnetic layer, has a composite structure including the second magnetostriction-enhancing layer and the magnetic layers disposed so as to be separated from each other by the second magnetostriction-enhancing layer.

Since the second thin-film layer is placed farthest in the magnetic thin-film layers from the first magnetostriction-enhancing layer, the second thin-film layer is rarely affected by the first magnetostriction-enhancing layer. Therefore, the second magnetostriction-enhancing layer is preferably disposed within the second thin-film layer to sufficiently magnetize the second thin-film layer and to strongly pin the resulting magnetization.

In the CPP-type magnetic sensing device, by forming the second thin-film layer having a composite structure including the second magnetostriction-enhancing layer and the magnetic layers disposed so as to be separated from each other by the second magnetostriction-enhancing layer, a difference in the spin-diffusion length between up-spin conduction electrons and down-spin conduction electrons can be amplified and a resistance change per unit area ($\Delta R \cdot A$) can be effectively enhanced.

In the present invention, current is preferably applied in the direction perpendicular to the interfaces of the layers of the multilayer material. Namely, the magnetic sensing device according to the present invention is preferably a CPP-type.

Even if the magnetic thin-film layer includes a thin-film layer composed of the second magnetostriction-enhancing layer and the magnetic layers disposed so as to be separated from each other by the second magnetostriction-enhancing layer, the reduction in the GMR property can be prevented in the CPP-type magnetic sensing device compared with the CIP-type magnetic sensing device.

It is preferable that the interfaces between the second magnetostriction-enhancing layer and the magnetic layers have a positive coefficient of spin-dependent interface scattering ($\gamma$ value) in order to prevent a decrease in the GMR effect.

In such interfaces, the second magnetostriction-enhancing layer is made of one or more materials selected from the group consisting of Pt, Pd, Ag, Ir and Rh.

In the CPP-type magnetic sensing device, the magnetic layers constituting the second thin-film layer is preferably made of a magnetic material having a positive coefficient of spin-dependent bulk scattering ($\beta$ value).

Specifically, the magnetic layers are preferably made of a Heusler alloy represented by a formula $Co_2MnY$ (wherein Y is one or more elements selected from the group consisting of Al, Si, Ga, Ge, and Sn) or are preferably made of a magnetic material selected from the group consisting of Co, CoFe, Co-Z, CoFe-Z (wherein Z denotes one or more elements selected from the group consisting of Ti, Zr, Ta, Hf, Sc, V, Mn, Y, and Nb), and Ni-Q (wherein Q denotes one or more elements selected from the group consisting of Rh, Ir, Be, Al, Si, Ga, Ge, Ti, Mn, Zn, Cd, and Sn).

The thickness of the second magnetostriction-enhancing layer must be small, preferably 1 to 5 Å, enough that ferromagnetic coupling mediates between the magnetic layers to magnetize all of the magnetic layers constituting the magnetic thin-film layer in the same direction and to pin the resulting magnetization.

In the present invention, the first magnetostriction-enhancing layer is preferably made of an X—Mn alloy (wherein X denotes one or more elements selected from the group consisting of Pt, Pd, Ir, Rh, Ru, Os, Ni, and Fe).

Preferably, the first magnetostriction-enhancing layer has a face-centered cubic (fcc) structure having a crystal plane (111) preferentially oriented in the direction parallel to the interface at a region near the interface with the first thin-film layer or the whole region, and the second magnetostriction-enhancing layer has a face-centered cubic (fcc) structure having a crystal plane (111) preferentially oriented in the direction parallel to the interfaces at regions near the interfaces with the magnetic layers or the whole regions.

In the present invention, preferably, the first thin-film layer has a face-centered cubic (fcc) structure having a crystal plane (111) preferentially oriented in the direction parallel to the interface with the first magnetostriction-enhancing layer at a region near the interface or the whole region, and/or the magnetic layers have a face-centered cubic (fcc) structure having a crystal plane (111) preferentially oriented in the direction parallel to the interfaces with the second magnetostriction-enhancing layer at regions near the interfaces or the whole regions.

Thus, an embodiment according to the present invention can provide the first magnetostriction-enhancing layer and the second magnetostriction-enhancing layer including an fcc structure having a crystal plane (111) preferentially oriented in the direction parallel to the interfaces.

When the first thin-film layer and/or the magnetic layers includes a fcc structure having a crystal plane (111) preferentially oriented in the direction parallel to the interfaces, atoms constituting the first thin-film layer and/or magnetic layers and atoms constituting the magnetostriction-enhancing layers readily overlap each other.

In the present invention, the first thin-film layer may include a body-centered cubic (bcc) lattice structure having a crystal plane (110) preferentially oriented in the direction parallel to the interface with the first magnetostriction-enhancing layer at a region near the interface or the whole region, and/or the magnetic layers may have a body-centered cubic (bcc) lattice structure having a crystal plane (110) preferentially oriented in the direction parallel to the interfaces with the second magnetostriction-enhancing layer at regions near the interfaces or the whole regions.

Even if the first thin-film layer and/or the magnetic layers includes a bcc structure having a crystal plane (110) preferentially oriented in the direction parallel to the interfaces, atoms constituting the first thin-film layer and/or magnetic layers and atoms constituting the magnetostriction-enhancing layers also readily overlap each other.

In the present invention, a magnetostriction constant of the first thin-film layer constituting the pinned magnetic layer is amplified by disposing the first thin-film layer in contact with the first magnetostriction-enhancing layer. At the same time, a magnetostriction constant of at least one magnetic thin-film layer constituting the pinned magnetic layer is also amplified from the inside by disposing the second magnetostriction-enhancing layer within the magnetic thin-film layer. With such a structure, a magnetostriction constant of the pinned magnetic layer can be totally increased.

With a structure that the second magnetostriction-enhancing layer is disposed within the magnetic thin-film layer, a magnetic coercive force of the magnetic thin-film layer is also increased by the effects of interface anisotropy and mutual diffusion at the interfaces.

As a result, magnetization of the pinned magnetic layer is more effectively pinned in the height direction. Therefore, distortion and asymmetry of reproduced waveforms, caused by disordered magnetization of the pinned magnetic layer by the longitudinal bias magnetic field from the hard bias layers, are decreased; inversion of the pinned magnetic layer caused by mechanical stress or the like can be prevented; and stable magnetization of the pinned magnetic layer can be also maintained regardless of a change in stress. Thus, the magnetic sensing device having a high reliability can be provided.

According to the present invention, the second magnetostriction-enhancing layer is disposed within the second thin-film layer, which is one of the magnetic thin-film layers constituting the pinned magnetic layer and is placed closest to the nonmagnetic material layer; thus, particularly in the CPP-type magnetic sensing device, magnetization of the entire pinned magnetic layer can be strongly pinned, and the GMR property can be effectively maintained.

DESCRIPTION OF THE PREFERRED EMBODIMENTS

Figure 1:
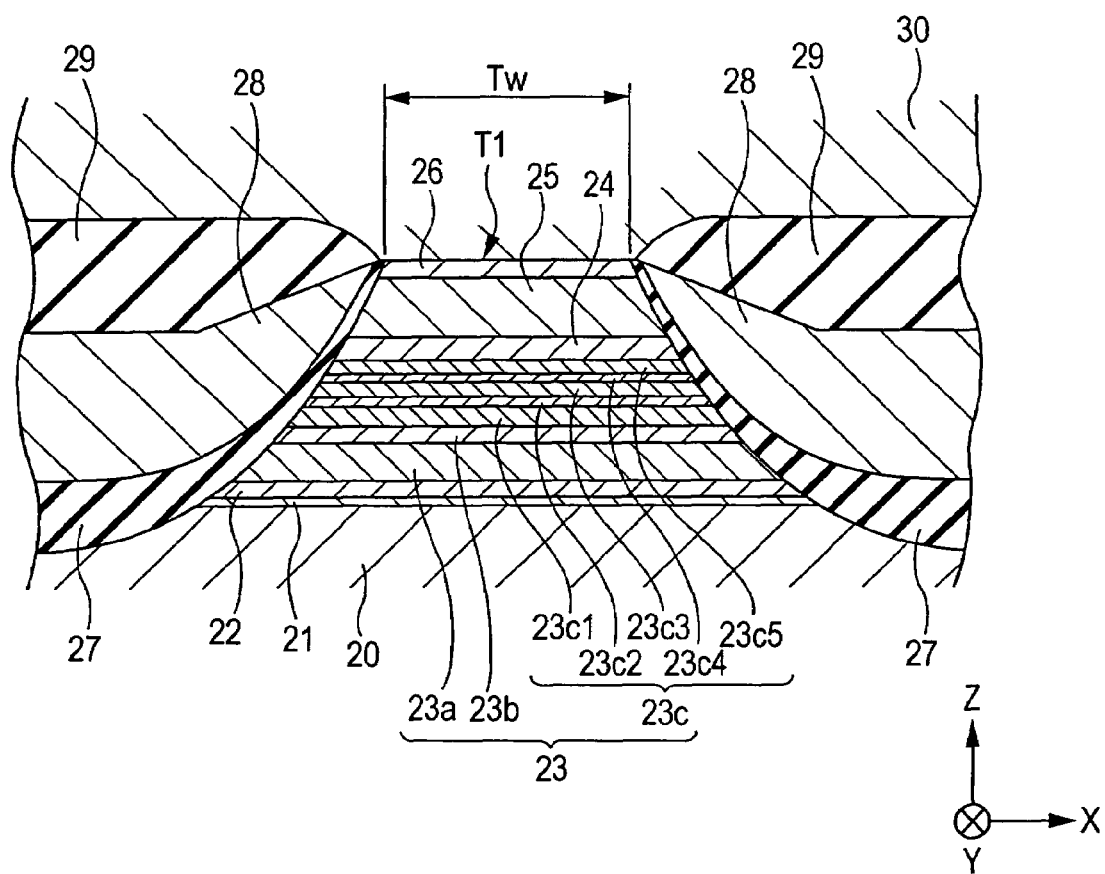
FIG. 1 is a cross-sectional view of a magnetic sensing device according to a first embodiment of the present invention, viewed from a side facing a recording medium.
Figure 4:
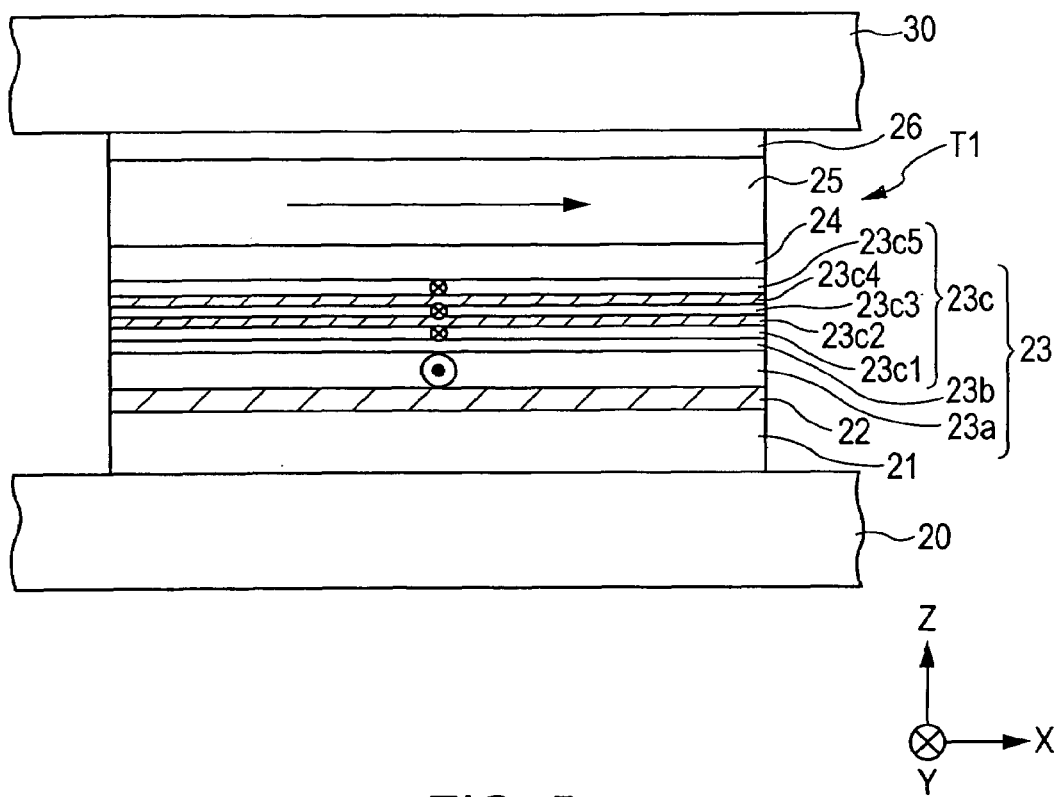
FIG. 4 is a partial schematic view of the magnetic sensing device shown in FIG. 1.

FIG. 1 is a cross-sectional view of a magnetic sensing device according to a first embodiment of the present invention, viewed from a side facing a recording medium. FIG. 4 is a partial schematic view of the magnetic sensing device shown in FIG. 1.

In the magnetic sensing device shown in FIGS. 1 and 4, a multilayer material T1 is disposed on a bottom shielding layer 20 made of a magnetic material.

In the magnetic sensing device shown in FIGS. 1 and 4, the multilayer material T1 is a composite composed of a seed layer 21, a first magnetostriction-enhancing layer 22, a pinned magnetic layer 23, a nonmagnetic material layer 24, a free magnetic layer 25, and a protective layer 26 in this order from the bottom.

The seed layer 21 is made of a Ni—Fe alloy, a Ni—Fe—Cr alloy, Cr, Ta, or the like. For example, the seed layer 21 is made of 60 atomic % $Ni_{0.8}Fe_{0.2}$ and 40 atomic % Cr, with a thickness of 35 to 60 Å.

The presence of the seed layer 21 improves (111) orientation of the first magnetostriction-enhancing layer 22 made of a nonmagnetic metal. The first magnetostriction-enhancing layer 22 will be described later.

The pinned magnetic layer 23 has an artificial ferri-structure which is a composite of a first thin-film layer 23a, a second thin-film layer 23c, and a nonmagnetic intermediate layer 23b made of Ru or the like disposed between the thin-film layers 23a and 23c. Furthermore, the second thin-film layer 23c has a five-layer structure consisting of three magnetic layers 23c1, 23c3, and 23c5 and two second magnetostriction-enhancing layers 23c2 and 23c4. The magnetic layers and the second magnetostriction-enhancing layers are alternately disposed so that the second magnetostriction-enhancing layers 23c2 and 23c4 are disposed between each of the magnetic layers 23c1, 23c3, and 23c5. Magnetization of the pinned magnetic layer 23 is pinned in the height direction (Y-direction in the drawings) by uniaxial anisotropy of the pinned magnetic layer 23 itself.

The nonmagnetic material layer 24 prevents magnetic coupling between the pinned magnetic layer 23 and the free magnetic layer 25, and is preferably made of an electrically conductive nonmagnetic material such as Cu, Cr, Au, or Ag. The nonmagnetic material layer made of Cu is most preferable. The nonmagnetic material layer 24 has a thickness of 17 to 50 Å.

The free magnetic layer 25 is made of a magnetic material such as a Ni—Fe alloy or a Co—Fe alloy. In the embodiment shown in FIG. 1, when the free magnetic layer 25 is made of a Ni—Fe alloy, a diffusion preventing layer (not shown) made of Co or CoFe is preferably disposed between the free magnetic layer 25 and the nonmagnetic material layer 24. The free magnetic layer 25 has a thickness of 20 to 100 Å, and may include an artificial ferri-structure having a composite composed of a plurality of thin-film layers and a nonmagnetic intermediate layer disposed between these thin-film layers.

The protective layer 26 is made of Ta, Ru, or the like, and prevents the multilayer material T1 from being oxidized. The protective layer 26 has a thickness of 10 to 50 Å.

In the embodiment shown in FIG. 1, a pair of insulating layers 27, hard bias layers 28, and insulating layers 29 are disposed on both sides of the multilayer material T1, from the seed layer 21 to the protective layer 26. Magnetization of the free magnetic layer 25 is aligned in the track width direction (X-direction in the drawings) by a longitudinal bias magnetic field from the hard bias layers 28.

A base layer (not shown) may be disposed between the insulating layer 27 and the hard bias layer 28. The base layers are made of Cr, W, a W—Ti alloy, a Fe—Cr alloy, or the like.

The insulating layers 27 and 29 are made of an insulating material such as $Al_2O_3$ or $SiO_2$ and insulate the top and bottom of the hard bias layer 28 in order to prevent current, which flows in the multilayer material T1 in the direction perpendicular to the interfaces of the layers of the multilayer material T1, from shunting to both sides of the multilayer material T1 in the track width direction.

The hard bias layers 28 are made of, for example, a Co—Pt alloy or a Co—Cr—Pt alloy.

A top shielding layer 30 made of a magnetic material is disposed on the insulating layers 29 and the protective layer 26. In the CPP-type magnetic sensing device shown in FIGS. 1 and 4, the bottom shielding layer 20 and the top shielding layer 30 function as electrodes to supply a current in the direction perpendicular to the interfaces of the layers of the multilayer material T1.

Magnetization of the free magnetic layer 25 is aligned in the track width direction (X-direction in the drawings) by the longitudinal bias magnetic field from the hard bias layers 28. Magnetization of the free magnetic layer 25 sensitively varies with a signal magnetic field (external magnetic field) from a recording medium. On the other hand, magnetization of the pinned magnetic layer 23 is pinned in the height direction (Y-direction in the drawings).

Electrical resistance varies according to the relationship between the change of the magnetization direction of the free magnetic layer 25 and the pinned magnetization direction of the pinned magnetic layer 23 (in particular, the pinned magnetization direction of the second thin-film layer 23c). A voltage change or a current change caused by the change of the electrical resistance is measured; thus, leakage field from a recording medium is detected.

The characterizing portion of this embodiment will be described.

FIG. 1 shows the magnetic sensing device according to the first embodiment. The magnetic sensing device mainly utilizes magnetoelastic effect that controls the uniaxial anisotropy for pinning magnetization of the pinned magnetic layer 23.

The magnetoelastic effect is controlled by magnetoelastic energy that is defined by a stress σ applied to the pinned magnetic layer 23 and a magnetostriction constant λs of the pinned magnetic layer 23.

Figure 2:
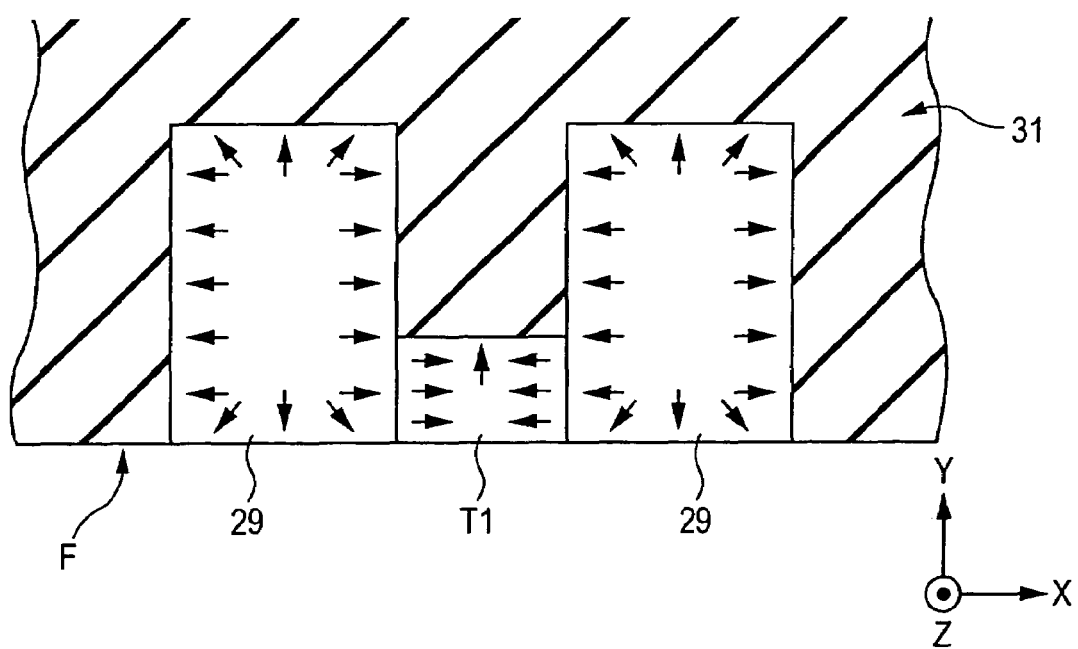
FIG. 2 is a plan view of the magnetic sensing device shown in FIG. 1.

FIG. 2 is a plan view of the magnetic sensing device shown in FIG. 1, viewed from the upper side of the drawing (the opposite direction of Z-direction in the drawings). The multilayer material T1 of the magnetic sensing device is disposed between the pair of insulating layers 27, hard bias layers 28, and the insulating layers 29. Since the insulating layers 27 and hard bias layers 28 are disposed under the insulating layers 29, the insulating layers 27 and the hard bias layers 28 are not shown in FIG. 2. The peripheries of the multilayer material T1, the insulating layers 27, the hard bias layers 28, and the insulating layers 29 is filled with insulating layer 31 indicated by diagonal lines in FIG. 2.

End faces F, facing a recording medium, of the multilayer material T1, the insulating layers 27, the hard bias layers 28, and the insulating layers 29 are exposed or merely covered with a thin protective film made of diamond-like carbon (DLC) or the like, with a thickness of 20 to 50 Å; i.e. the end faces F are open ends.

Therefore, although the bottom shielding layer 20 and the top shielding layer 30 originally have two-dimensional isotropy, stress from these shielding layers 20 and 30 is released at the open end faces F. This causes breakage of their symmetry property. As a result, tensile stress is applied to the multilayer material T1 in the direction parallel to the height direction (Y-direction in the drawings). When the composite composed of the insulating layers 27, the hard bias layers 28, and the insulating layers 29 has compressive internal stress, the insulating layers tend to extend toward the center. As a result, compressive stress is applied to the multilayer material T1 in the direction parallel and antiparallel to the track width direction (X-direction in the drawings).

Namely, the pinned magnetic layer 23 having an open end face F facing the recording medium is provided with tensile stress in the height direction (Y-direction in the drawings) and compressive stress in the track width direction (X-direction in the drawings). Since the first thin-film layer 23a and the second thin-film layer 23c are formed to include magnetic layers having a positive magnetostriction constant λs, axes of easy magnetization of the first thin-film layer 23a and the second thin-film layer 23c are parallel to the depth direction (height direction: Y-direction in the drawings) of the magnetic sensing device, by the magnetoelastic effect. Thus, magnetization of the first thin-film layer 23a and the second thin-film layer 23c is pinned in the direction parallel or antiparallel to the height direction. Magnetization of the first thin-film layer 23a and the second thin-film layer 23c is pinned in the antiparallel to each other by the RKKY (Ruderman-Kittel-Kasuda-Yosida) interaction between the first thin-film layer 23a and the second thin-film layer 23c.

In the magnetic sensing device according to the present invention, the magnetoelastic energy is enhanced by increasing a magnetostriction constant λs of the pinned magnetic layer 23, resulting in an increase in uniaxial anisotropy of the pinned magnetic layer 23. As the uniaxial anisotropy of the pinned magnetic layer 23 increases, the magnetization of the pinned magnetic layer 23 is strongly pinned in a certain direction, output from the magnetic sensing device increases, and stability and symmetry property of the output are improved.

A structure for increasing the magnetostriction constant λs of the pinned magnetic layer 23 will be described. The first thin-film layer 23a constituting the pinned magnetic layer 23 of the magnetic sensing device shown in FIGS. 1 and 4 is disposed farthest from the nonmagnetic material layer 24 in the magnetic layers constituting the pinned magnetic layer 23. Furthermore, the first magnetostriction-enhancing layer 22 made of a nonmagnetic metal is disposed on the first thin-film layer 23a so that the first magnetostriction-enhancing layer 22 is remote from the nonmagnetic material layer 24 separated by the first thin-film layer 23a. This causes distortion of the crystalline structure of the first thin-film layer 23a and an increase in the magnetostriction constant λs of the first thin-film layer 23a.

The distance between nearest-neighbor atoms of the nonmagnetic intermediate layer 23b made of Ru or the like in a plane parallel to the interface is slightly larger than of the first thin-film layer 23a in a plane parallel to the interface (a mismatch value of about 8%, which is described later). Therefore, the nonmagnetic intermediate layer 23b can exhibit magnetostriction-enhancing effect, though the magnetostriction-enhancing effect is smaller than that of the first magnetostriction-enhancing layer 22. With such a structure, the crystalline structure of the first thin-film layer 23a is distorted by the nonmagnetic intermediate layer 23b and the first magnetostriction-enhancing layer 22 and the magnetostriction constant λs of the first thin-film layer 23a is sufficiently increased.

Since the second thin-film layer 23c is disposed on the nonmagnetic intermediate layer 23b, the crystalline structure of the second thin-film layer 23c is slightly distorted at a region near the bottom face. However, the magnetostriction-enhancing effect of the nonmagnetic intermediate layer 23b is not enough for sufficiently increasing the magnetostriction constant λs of the entire second thin-film layer 23c.

On the other hand, the nonmagnetic material layer 24 disposed on the second thin-film layer 23c is made of Cu or the like. The nonmagnetic material layer 24 made of Cu cannot distort the crystalline structure of the second thin-film layer 23c because such a nonmagnetic material layer 24 has a lattice constant almost the same as that of the second thin-film layer 23c. As a result, the top face of the second thin-film layer 23c is rarely provided with magnetostriction-enhancing effect.

A coefficient of spin-dependent interface scattering (γ value) defined by a interface structure between the nonmagnetic material layer 24 made of Cu and the second thin-film layer 23c slightly affects a resistance change per unit area (ΔR·A) of the CPP-GMR device, though it largely affects magnetoresistive property of a CIP-GMR device. Therefore, the interface structure between the nonmagnetic material layer 24 and the second thin-film layer 23c should not be modified.

The present invention provides a structure for increasing the magnetostriction constant λs of the entire second thin-film layer 23c by disposing the second magnetostriction-enhancing layers 23c2 and 23c4 within the second thin-film layer 23c.

As shown in FIGS. 1 and 4, the second thin-film layer 23c has a five-layer structure consisting of three magnetic layers 23c1, 23c3, and 23c5 and two second magnetostriction-enhancing layers 23c2 and 23c4. The magnetic layers and the second magnetostriction-enhancing layers are alternately disposed so that the second magnetostriction-enhancing layers 23c2 and 23c4 are disposed between each of the magnetic layers 23c1, 23c3, and 23c5. With this structure, the crystalline structures of the magnetic layers 23c1, 23c3, and 23c5 constituting the second thin-film layer 23c are distorted to increase the magnetostriction constant λs of the entire second thin-film layer 23c.

Preferably, all of the first magnetostriction-enhancing layer 22, the second magnetostriction-enhancing layers 23c2 and 23c4, the first thin-film layer 23a, and the magnetic layers 23c1, 23c3, and 23c5 have a face-centered cubic (fcc) lattice structure having a crystal plane (111) preferentially oriented in the direction parallel to the interface in order to improve their crystallization. In such a structure, it is preferable that a value (referred to as a mismatch value) obtained by dividing a difference between a distance between nearest-neighbor atoms in the (111) plane of the first magnetostriction-enhancing layer 22 and a distance between nearest-neighbor atoms in the (111) plane of the first thin-film layer 23a of the pinned magnetic layer 23 by a distance between nearest-neighbor atoms in the (111) plane of the first thin-film layer 23a be between 0.05 and 0.20. At the same time, it is preferable that a value (referred to as a mismatch value) obtained by dividing a difference between a distance between nearest-neighbor atoms in the (111) plane of the second magnetostriction-enhancing layer 23c2 or 23c4 and a distance between nearest-neighbor atoms in the (111) plane of the magnetic layer 23c1, 23c3, or 23c5 constituting the second thin-film layer 23c of the pinned magnetic layer 23 by a distance between nearest-neighbor atoms in the (111) plane of the magnetic layer 23c1, 23c3, or 23c5 be between 0.05 and 0.20.

Figure 3:
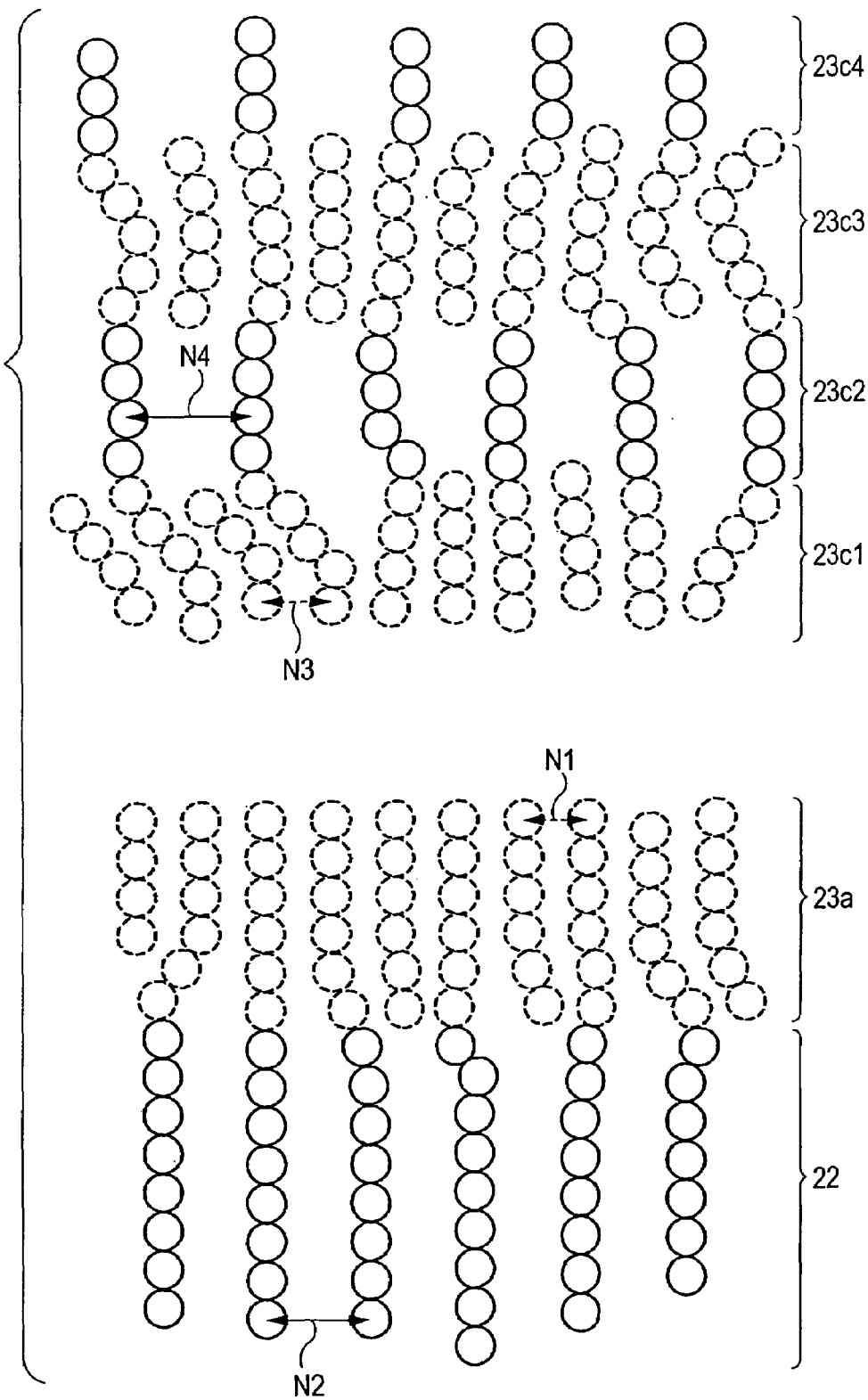
FIG. 3 is a schematic diagram illustrating a state that distortion is generated while a magnetostriction-enhancing layer and a pinned magnetic layer are aligned.

As schematically shown in FIG. 3, in the magnetic sensing device according to the embodiment of the present invention, a crystalline structure near the interface between the first magnetostriction-enhancing layer 22 and the first thin-film layer 23a is distorted while atoms constituting the first magnetostriction-enhancing layer 22 and atoms constituting the first thin-film layer 23a are aligned with each other. In the same way, crystalline structures near the interfaces between the second magnetostriction-enhancing layer 23c2 or 23c4 and the magnetic layer 23c1, 23c3, or 23c5 are distorted while atoms constituting the second magnetostriction-enhancing layer 23c2 and 23c4 and atoms constituting the magnetic layers 23c1, 23c3, and 23c5 are aligned with each other.

In FIG. 3, N1 denotes a distance between nearest-neighbor atoms in the (111) plane of the first thin-film layer 23a, N2 denotes a distance between nearest-neighbor atoms in the (111) plane of the first magnetostriction-enhancing layer 22, N3 denotes a distance between nearest-neighbor atoms in the (111) planes of the magnetic layers 23c1, 23c3, and 23c5, and N4 denotes a distance between nearest-neighbor atoms in the (111) planes of the second magnetostriction-enhancing layers 23c2 and 23c4. N1, N2, N3, and N4 are measured at regions far from the interfaces of the layers to avoid the influence of the distortion.

With reference to FIG. 3, at least some crystals in the first magnetostriction-enhancing layer 22 and in the first thin-film layer 23a are epitaxially grown; consequently, the crystalline structure of the first thin-film layer 23a is distorted to increase a magnetostriction constant λs of the first thin-film layer 23a. In the same way, at least some crystals of the second magnetostriction-enhancing layers 23c2 and 23c4 and of the magnetic layers 23c1, 23c3, and 23c5 are epitaxially grown; consequently, the crystalline structures of the magnetic layers 23c1, 23c3, and 23c5 are distorted to increase a magnetostriction constant λs of the second thin-film layer 23c.

In the present invention, almost all of the atoms constituting the first magnetostriction-enhancing layer 22 must be correctly aligned with the atoms constituting the first thin-film layer 23a at a region near the interface between the first thin-film layer 23a and the first magnetostriction-enhancing layer 22. In the same way, almost all of the atoms constituting the second magnetostriction-enhancing layers 23c2 and 23c4 must be correctly aligned with the atoms constituting the magnetic layers 23c1, 23c3, and 23c5 at regions near the interfaces between the magnetic layer 23c1, 23c3, or 23c5 and the second magnetostriction-enhancing layer 23c2 or 23c4. For example, as schematically shown in FIG. 3, there may be regions where the atoms constituting the first thin-film layer 23a are not aligned with the atoms constituting the first magnetostriction-enhancing layer 22, or regions where the atoms constituting the magnetic layers 23c1, 23c3, and 23c5 are not aligned with the atoms constituting the second magnetostriction-enhancing layers 23c2 and 23c4. A small number of non-epitaxial crystal grains in nonconformity with polycrystalline substances may be contained in the polycrystalline substances.

With a structure that the second magnetostriction-enhancing layers 23c2 and 23c4 are disposed within the second thin-film layer 23c, a magnetic coercive force of the second thin-film layer 23c can be increased by the effects of interface anisotropy and mutual diffusion at the interfaces.

As a result, magnetization of the pinned magnetic layer 23 is more effectively pinned in the height direction. Therefore, distortion and asymmetry of reproduced waveforms, caused by the disordered magnetization of the pinned magnetic layer 23 by the longitudinal bias magnetic field from the hard bias layers, are decreased; inversion of the pinned magnetic layer 23 caused by mechanical stress or the like can be prevented; and stable magnetization of the pinned magnetic layer 23 can be also maintained regardless of a change in stress. Thus, the magnetic sensing device having a high reliability can be provided.

In the CPP-type magnetic sensing device shown in FIGS. 1 and 4, the spin-dependent bulk scattering highly affects the GMR effect. In the present invention, a coefficient of spin-dependent bulk scattering ($\beta$ value), which has an influence on the GMR effect, of the magnetic layers 23c1, 23c3, and 23c5 constituting the second thin-film layer 23c is preferably a positive value.

Examples of magnetic materials having a positive coefficient of spin-dependent bulk scattering ($\beta$ value) include Co, CoFe, Co-Z, CoFe-Z (wherein Z denotes one or more elements selected from the group consisting of Ti, Zr, Ta, Hf, Sc, V, Mn, Y, and Nb), and Ni-Q (wherein Q denotes one or more elements selected from the group consisting of Rh, Ir, Be, Al, Si, Ga, Ge, Ti, Mn, Zn, Cd, and Sn).

These magnetic materials can be also used for the first thin-film layer 23a constituting the pinned magnetic layer 23.

In the present invention, the magnetic layers 23c1, 23c3, and 23c5 constituting the second thin-film layer 23c are preferably made of a Heusler alloy having a formula of $CO_2MnY$ (wherein Y denotes one or more elements selected from the group consisting of Al, Si, Ga, Ge, and Sn).

The Heusler alloy has a positive coefficient of spin-dependent bulk scattering ($\beta$ value) and this $\beta$ value is relatively large (specifically, 0.7 ore more). The coefficient of spin-dependent bulk scattering ($\beta$ value) has a relationship represented by the following equation: $\rho\downarrow/\rho\uparrow=(1+\beta)/(1-\beta)$, wherein $\rho\downarrow$ denotes a resistivity value for down-spin conduction electrons and $\rho\uparrow$ denotes a resistivity value for up-spin conduction electrons.

When the coefficient of spin-dependent bulk scattering ($\beta$ value) is a positive value, the value of $\rho\downarrow/\rho\uparrow$ is larger than 1; namely, the $\rho\downarrow$ is larger than the $\rho\uparrow$ ($\rho\downarrow>\rho\uparrow$). Therefore, the down-spin conduction electrons can hardly, or cannot at all, flow in the ferromagnetic layer, and the mean free path and spin-diffusion length of the down-spin conduction electrons become shorter (i.e. an insulating behavior is performed). On the other hand, the up-spin conduction electrons can readily flow in the ferromagnetic layer to lengthen their mean free path and spin-diffusion length (i.e. a metallic behavior is performed). As a result, the differential mean free path and spin-diffusion length between the up-spin conduction electrons and the down-spin conduction electrons are increased. This is called spin polarization. The spin polarization becomes stronger with the $\beta$ value of the Heusler alloy. Therefore, the Heusler alloy having a high $\beta$ value can further increase the differential mean free path and spin-diffusion length.

A resistance change per unit area ($\Delta R\cdot A$) and a rate of resistance change ($\Delta R/R$) have a positive correlation with the differential mean free path and spin-diffusion length between the up-spin conduction electrons and the down-spin conduction electrons. Therefore, by increasing the coefficient of spin-dependent bulk scattering ($\beta$ value), the differential mean free path and spin-diffusion length between the up-spin conduction electrons and the down-spin conduction electrons are amplified and the resistance change per unit area ($\Delta R\cdot A$) van be enhanced. Thus, the magnetic sensing devices able to satisfactorily respond to high recording density can be manufactured.

In the present invention, it is necessary that a coefficient of spin-dependent scattering [coefficient of spin-dependent interface scattering ($\gamma$ value)] at the interfaces between the magnetic layer 23c1, 23c3, or 23c5 and the second magnetostriction-enhancing layer 23c2 or 23c4 constituting the second thin-film layer 23c is a positive value.

The second magnetostriction-enhancing layers 23c2 and 23c4 must be made of a nonmagnetic metallic material having a lattice constant larger than that of the magnetic layers 23c1, 23c3, and 23c5 so that the magnetostriction-enhancing effect for producing distortion in the magnetic layers 23c1, 23c3, and 23c5 is sufficiently performed.

Specifically, the second magnetostriction-enhancing layers 23c2 and 23c4 are preferably made of one or more materials selected from the group consisting of Pt, Pd, Ag, Ir, and Rh.

Amorphous materials are not preferable as the nonmagnetic metallic materials. For example, since Ti, Zr, and Ta tend to form an amorphous alloy, the resistivity of the second magnetostriction-enhancing layers 23c2 and 23c4 made of these nonmagnetic metallic materials is increased. Therefore, such second magnetostriction-enhancing layers are not preferable.

In the second magnetostriction-enhancing layers 23c2 and 23c4 made of Au, since Au tends to diffuse into the magnetic layers 23c1, 23c3, and 23c5, a solid solution is formed and a composite structure shown in FIGS. 1 and 4 is hardly formed. Therefore, Au is not preferable for the second magnetostriction-enhancing layers 23c2 and 23c4 from the viewpoint of the GMR effect.

When a coefficient of spin-dependent scattering [coefficient of spin-dependent interface scattering ($\gamma$ value)] at the interfaces between the magnetic layers 23c1, 23c3, and 23c5 and the second magnetostriction-enhancing layers 23c2 and 23c4 is a positive value, the up-spin conduction electrons can pass through the interfaces without diffusion or scattering and the mean free path and spin-diffusion length of the up-spin conduction electrons become longer. At the same time, the down-spin conduction electrons are readily prevented from passing through the interfaces and the mean free path and spin-diffusion length of the down-spin conduction electrons become shorter. As a result, the differential mean free path and spin-diffusion length between the up-spin conduction electrons and the down-spin conduction electrons are sufficiently increased.

Figure 5:
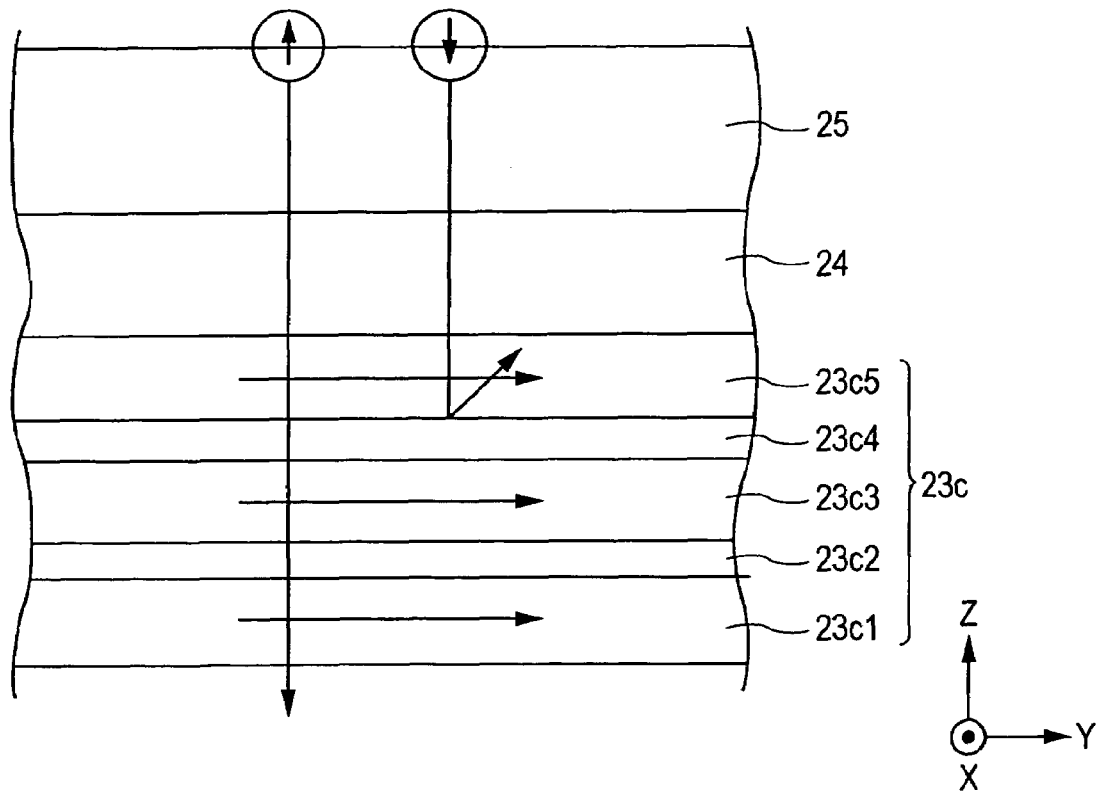
FIG. 5 is a schematic diagram illustrating mean free paths of up-spin conduction electrons and down-spin conduction electrons.

With reference to FIG. 5 schematically illustrating the principle (magnetization of all of the magnetic layers 23c1, 23c3, and 23c5 is directed to the right in FIG. 5), the down-spin conduction electrons are readily diffused at the interfaces between the second magnetostriction-enhancing layer 23c2 or 23c4 and the magnetic layer 23c1, 23c3, or 23c5 by disposing the second magnetostriction-enhancing layers 23c2 and 23c4 within the second thin-film layer 23c.

In other words, the second magnetostriction-enhancing layers 23c2 and 23c4 disposed within the second thin-film layer 23c function not only to enhance the magnetostriction and magnetic coercive force of the second thin-film layer 23c but also to sufficiently increase the difference between the mean free paths of the up-spin conduction electrons and the down-spin conduction electrons. Thus, the GMR property can be further improved.

As shown in FIGS. 4 and 5, all of the magnetic layers 23c1, 23c3, and 23c5 constituting the second thin-film layer 23c are magnetized and pinned in the same direction antiparallel to the magnetization of the first thin-film layer 23a.

Antiparallel coupling by the RKKY interaction mediates between the first thin-film layer 23a and the second thin-film layer 23c via the nonmagnetic intermediate layer 23b made of Ru or the like. On the other hand, in the second thin-film layer 23c, ferromagnetic coupling must mediate between the magnetic layers 23c1, 23c3, and 23c5 to magnetize and pin all of the magnetic layers 23c1, 23c3, and 23c5 in the same direction.

In order to produce strong ferromagnetic coupling between each of the magnetic layers 23c1, 23c3, and 23c5, thicknesses of the second magnetostriction-enhancing layers 23c2 and 23c4 must be adequately controlled.

As the thicknesses of the second magnetostriction-enhancing layers 23c2 and 23c4 increase, problems arise. For example, the ferromagnetic coupling mediating between the magnetic layers 23c1, 23c3, and 23c5 is decreased, or antiparallel coupling causes antiparallel magnetization between the magnetic layers 23c1, 23c3, and 23c5. Therefore, thicknesses of the second magnetostriction-enhancing layers 23c2 and 23c4 must be small enough to produce strong ferromagnetic coupling between each of the magnetic layers 23c1, 23c3, and 23c5.

Figure 6:
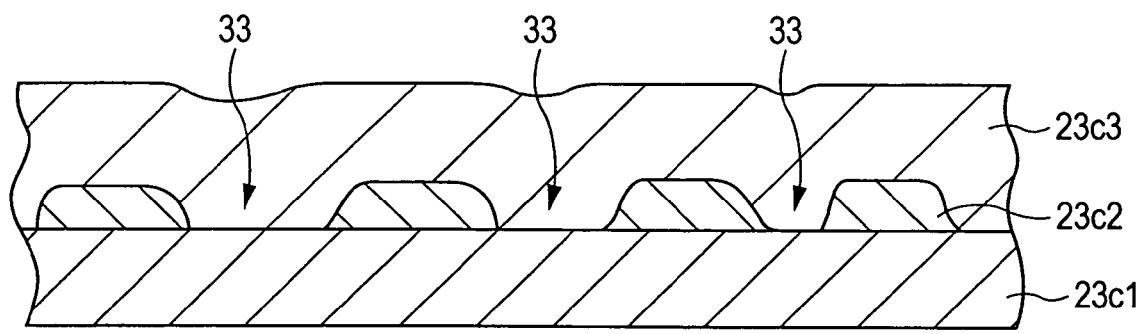
FIG. 6 is a partially enlarged sectional view of a composite composed of magnetic layers and a second magnetostriction-enhancing layer which constitute a second thin-film layer of a pinned magnetic layer.

Specifically, the second magnetostriction-enhancing layers 23c2 and 23c4 preferably have a thickness of 1 to 5 Å. With such a thickness, the second magnetostriction-enhancing layers 23c2 and 23c4 can adequately produce ferromagnetic coupling between each of the magnetic layers 23c1, 23c3, and 23c5 by RKKY interaction. As shown in FIG. 6 (only the magnetic layers 23c1 and 23c3 and the second magnetostriction-enhancing layer 23c2 are drawn in FIG. 6), when the thicknesses of the second magnetostriction-enhancing layers 23c2 and 23c4 are small, pinholes 33 are formed in the second magnetostriction-enhancing layers 23c2 and 23c4. The magnetic layers 23c1, 23c3, and 23c5 come into direct contact with each other through the pinholes 33, and the direct exchange interaction between the magnetic layers 23c1, 23c3, and 23c5 readily occurs.

Figure 7:
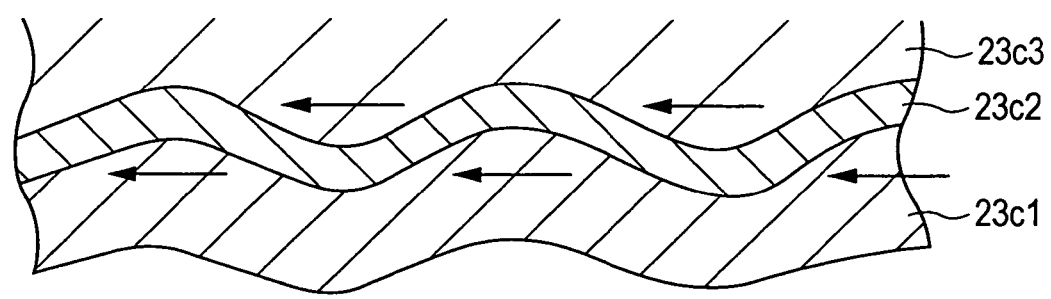
FIG. 7 is a partially enlarged sectional view of another composite composed of the magnetic layers and the second magnetostriction-enhancing layer which constitute a second thin-film layer of a pinned magnetic layer.

As shown in FIG. 7 (only the magnetic layers 23c1 and 23c3 and the second magnetostriction-enhancing layer 23c2 are drawn in FIG. 7), when a waviness is formed at the interfaces between the magnetic layer 23c1, 23c3, or 23c5 and the second magnetostriction-enhancing layer 23c2 or 23c4, magnetostatic interaction called a topological coupling is generated to magnetize each of the magnetic layers 23c1, 23c3, and 23c5 in parallel to each other. In particular, when the second magnetostriction-enhancing layer 23c2 has the pinholes 33 as shown in FIG. 6, the waviness is readily formed in the surface of the magnetic layer 23c3 disposed on the second magnetostriction-enhancing layer 23c2. Consequently, the topological coupling is readily generated between the magnetic layers 23c3 and the magnetic layer 23c5 separated by the second magnetostriction-enhancing layers 23c4.

The lower limit of the thickness of the second magnetostriction-enhancing layers 23c2 and 23c4 is 1 Å because atoms constituting the second magnetostriction-enhancing layers 23c2 and 23c4 have a diameter of about 1 Å.

The first magnetostriction-enhancing layer 22 (which will be described later) must be formed to have a thickness of the range for sufficiently increasing a magnetostriction constant λs of the first thin-film layer 23a, but is not required to have an extremely small thickness as in the second magnetostriction-enhancing layers 23c2 and 23c4. Therefore, the first magnetostriction-enhancing layer 22 has a thickness larger than those of the second magnetostriction-enhancing layers 23c2 and 23c4. Namely, the second magnetostriction-enhancing layers 23c2 and 23c4 are formed to have a thickness smaller than that of the first magnetostriction-enhancing layer 22.

The second thin-film layer 23c shown in FIGS. 1 and 4 includes two second magnetostriction-enhancing layers 23c2 and 23c4, however, the second thin-film layer 23c may include a single second magnetostriction-enhancing layer. Contrarily, the second thin-film layer 23c may have more than three magnetic layers, however, as the number of the magnetic layers increases, the magnetization of each magnetic layer is weakly pinned. Therefore, a structure including three magnetic layers, as shown in FIGS. 1 and 4, is preferable.

Materials used for the first magnetostriction-enhancing layer 22 will be described. The first magnetostriction-enhancing layer 22 must be made of a nonmagnetic metallic material having a lattice constant larger than that of the first thin-film layer 23a. Since the second magnetostriction-enhancing layers 23c2 and 23c4 directly affect the resistance change per unit area (ΔR·A), they have restriction on selection of materials in order to attain the various conditions. However, the first magnetostriction-enhancing layer 22 does not directly affect the resistance change per unit area (ΔR·A). Therefore, for example, even if a coefficient of spin-dependent interface scattering (γ value) of the interface between the first magnetostriction-enhancing layer 22 and the first thin-film layer 23a is a negative value, the resistance change per unit area (ΔR·A) is not directly affected. Consequently, various kinds of materials can be used for the first magnetostriction-enhancing layer 22 compared with the second magnetostriction-enhancing layers 23c2 and 23c4.

Examples of the materials for the first magnetostriction-enhancing layer 22 include Pt, Au, Pd, Ag, Ir, and Rh. Materials having a negative coefficient of spin-dependent interface scattering (γ value), such as Ru, Re, Mo, and W, can be also used for forming the first magnetostriction-enhancing layer 22.

The first magnetostriction-enhancing layer 22 may be made of an X—Mn alloy (wherein X denotes one or more elements selected from the group consisting of Pt, Pd, Ir, Rh, Ru, Os, Ni, and Fe). The X—Mn alloy has a relatively high resistivity, so it is not suitable for the second magnetostriction-enhancing layers 23c2 and 23c4.

The thickness of the first magnetostriction-enhancing layer 22 ranges from about 5 to 50 Å.

With such a thickness, the first magnetostriction-enhancing layer 22 made of the X—Mn alloy (wherein X denotes one or more elements selected from the group consisting of Pt, Pd, Ir, Rh, Ru, Os, Ni, and Fe) can maintain a face-centered cubic (fcc) structure generated during the film-forming process. When a thickness of the crystalline structure of the first magnetostriction-enhancing layer 22 is larger than 50 Å, the fcc structure is transformed to a CuAu—I-type ordered face-centered tetragonal (fct) structure by being heated at a temperature higher than 250° C. Therefore, the first magnetostriction-enhancing layer 22 having a thickness larger than 50 Å is not preferable. However, if the first magnetostriction-enhancing layer 22 is not heated at a temperature higher than 250° C., the face-centered cubic (fcc) structure can be maintained even if the first magnetostriction-enhancing layer 22 has a thickness larger than 50 Å.

When the first magnetostriction-enhancing layer 22 is made of the X—Mn alloy, the X element content of the X—Mn alloy preferably ranges from 45 atomic % to 99 atomic %. With such a content of X element, the first thin-film layer 23a can be stabilized with large magnetostriction.

Preferably, the first magnetostriction-enhancing layer 22 has a face-centered cubic (fcc) structure having a crystal plane (111) preferentially oriented in the direction parallel to the interface at a region near the interface with the first thin-film layer 23a or the whole region. In the same way, the second magnetostriction-enhancing layers 23c2 and 23c4 also have a face-centered cubic (fcc) structure having a crystal plane (111) preferentially oriented in the direction parallel to the interface at regions near the interfaces with the magnetic layers 23c1, 23c3, and 23c5 or the whole regions.

Preferably, the first thin-film layer 23a also has a face-centered cubic (fcc) structure having a crystal plane (111) preferentially oriented in the direction parallel to the interface at a region near the interface with the first magnetostriction-enhancing layer 22 or the whole region; and/or the magnetic layers 23c1, 23c3, and 23c5 have a face-centered cubic (fcc) structure having a crystal plane (111) preferentially oriented in the direction parallel to the interfaces at regions near the interfaces with the second magnetostriction-enhancing layers 23c2 and 23c4 or the whole regions.

With such crystalline orientation, atoms constituting the first thin-film layer 23a and atoms constituting the first magnetostriction-enhancing layer 22 readily overlap each other; and atoms constituting the magnetic layers 23c1, 23c3, and 23c5 and atoms constituting the second magnetostriction-enhancing layers 23c2 and 23c4 readily overlap each other. Consequently, crystals in the magnetostriction-enhancing layers 22, 23c2, and 23c4 and crystals in the magnetic layers 23c1, 23c2, and 23c3 constituting the pinned magnetic layer 23 grow epitaxially.

In the present invention, the first thin-film layer 23a may have a body-centered cubic (bcc) lattice structure having a crystal plane (110) preferentially oriented in the direction parallel to the interface at the region near the interface with the first magnetostriction-enhancing layer 22 or the whole region; and/or the magnetic layers 23c1, 23c3, and 23c5 may have a body-centered cubic (bcc) lattice structure having a crystal plane (110) preferentially oriented in the direction parallel to the interfaces at the regions near the interfaces with the second magnetostriction-enhancing layers 23c2 and 23c4 or the whole regions.

In such a structure, it is preferable that the first magnetostriction-enhancing layer 22 have a face-centered cubic (fcc) structure having a crystal plane (111) preferentially oriented in the direction parallel to the interface at the region near the interface with the first thin-film layer 23a or the whole region, and that the second magnetostriction-enhancing layers 23c2 and 23c4 also have a face-centered cubic (fcc) structure having a crystal plane (111) preferentially oriented in the direction parallel to the interfaces at the regions near the interfaces with the magnetic layers 23c1, 23c3, and 23c5 or the whole regions.

Atomic arrangement on the crystal plane (110) in the bcc structure is similar to that on the crystal plane (111) in the fcc structure. Therefore, crystals having the bcc structure and crystals having the fcc structure can be aligned to be overlapped each other; i.e. they are aligned in a heteroepitaxial state.

In the magnetic sensing device shown in FIGS. 1 and 4, the first thin-film layer 23a is composed of a single layer. However, the first thin-film layer 23a may be composed of magnetostriction-enhancing layers and a plurality of magnetic layers disposed so as to be separated from each other by the magnetostriction-enhancing layers, as in the second thin-film layer 23c.

The pinned magnetic layer 23 may have nonmagnetic intermediate layers and three or more magnetic layers disposed so as to be separated from each other by the nonmagnetic intermediate layers. In such a structure, preferably, the magnetic layer (the second thin-film layer in the present invention) disposed closest to the nonmagnetic material layer 24 is a composite composed of a second magnetostriction-enhancing layer and a plurality of magnetic layers disposed so as to be separated from each other by the second magnetostriction-enhancing layer.

Furthermore, at least one of the magnetic thin-film layers constituting the pinned magnetic layer 23 must include a second magnetostriction-enhancing layer and a plurality of magnetic layers disposed so as to be separated from each other by the second magnetostriction-enhancing layer. Namely, only the first thin-film layer 23a farthest from the nonmagnetic material layer 24 may be composed of the second magnetostriction-enhancing layer and the plurality of magnetic layers disposed so as to be separated from each other by the second magnetostriction-enhancing layer.

As described above, in the CPP-type magnetic sensing device shown in FIGS. 1 and 4, a magnetostriction constant of the first thin-film layer 23a is enhanced from the outside by connecting the first magnetostriction-enhancing layer 22 to the first thin-film layer 23a that is one of the magnetic thin-film layers constituting the pinned magnetic layer 23 and does not directly affect the GMR effect. Furthermore, a magnetostriction constant of the second thin-film layer 23c is enhanced from the inside by disposing the second magnetostriction-enhancing layers 23c2 and 23c4 within the second thin-film layer 23c that affects the GMR effect. With such a structure, a magnetostriction constant and magnetic coercive force of the entire pinned magnetic layer 23 can be increased, while excellent GMR effect is maintained. Thus, the pinned magnetic layer 23 can be sufficiently magnetized and the magnetization is strongly pinned.

Figure 8:
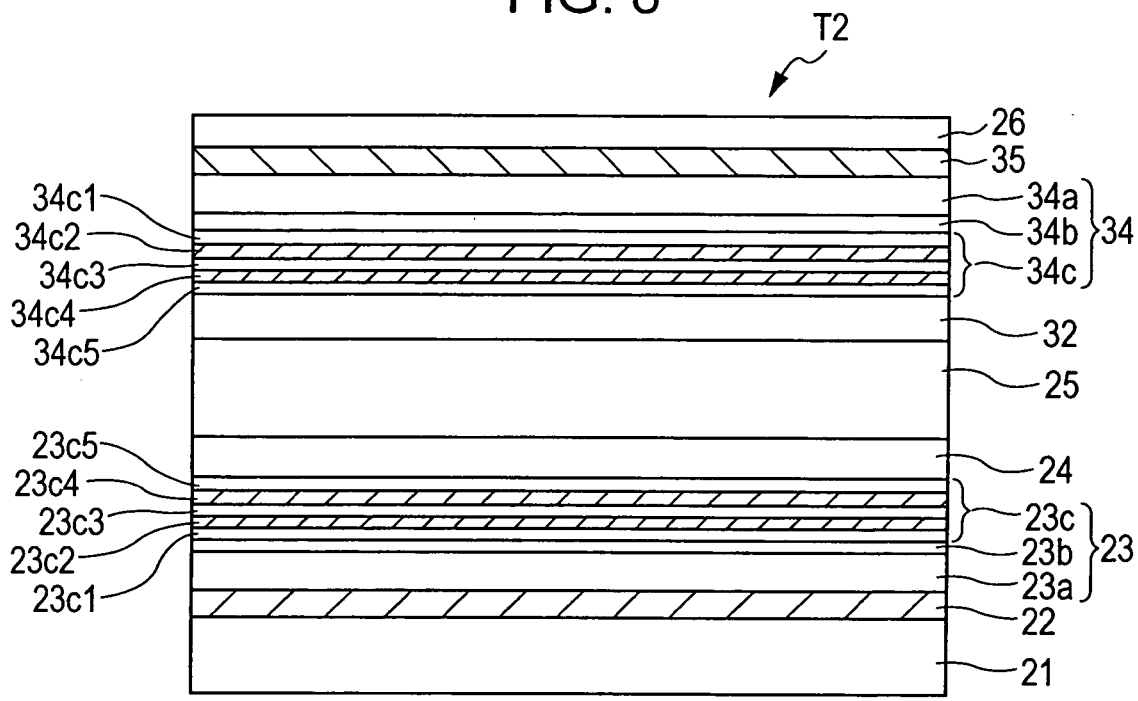
FIG. 8 is a partial schematic view of a magnetic sensing device according to a second embodiment of the present invention, viewed from a side facing a recording medium.

FIG. 8 is a schematic view of a structure of a multilayer material T2 different from that of the multilayer material T1 of the CPP-type magnetic sensing device shown in FIG. 1. The multilayer material T2 shown in FIG. 8 has a structure of a dual-spin-valve-type thin-film device. Specifically, nonmagnetic material layers 24 and 32 are disposed on a free magnetic layer 25; a pinned magnetic layer 23 having an artificial ferri-structure including a first thin-film layer 23a, a nonmagnetic intermediate layer 23b, and a second thin-film layer 23c is disposed on the nonmagnetic material layer 24 so that the second thin-film layer 23c is contact with the nonmagnetic material layer 24; a pinned magnetic layer 34 having an artificial ferri-structure including a first thin-film layer 34a, a nonmagnetic intermediate layer 34b, and a second thin-film layer 34c is disposed on the nonmagnetic material layer 32 so that the second thin-film layer 34c is contact with the nonmagnetic material layer 32; first magnetostriction-enhancing layers 22 and 35 are disposed on the pinned magnetic layers 23 and 34, respectively; a seed layer 21 is disposed on the first magnetostriction-enhancing layer 22; and a protective layer 26 is disposed on the first magnetostriction-enhancing layer 35.

As shown in FIG. 8, the second thin-film layer 23c has a composite structure including a plurality of magnetic layers 23c1, 23c3, and 23c5 and second magnetostriction-enhancing layers 23c2 and 23c4 disposed between each of these magnetic layers. The second thin-film layer 34c has a composite structure including a plurality of magnetic layers 34c1, 34c3, and 34c5 and second magnetostriction-enhancing layers 34c2 and 34c4 disposed between each of these magnetic layers.

Figure 9:
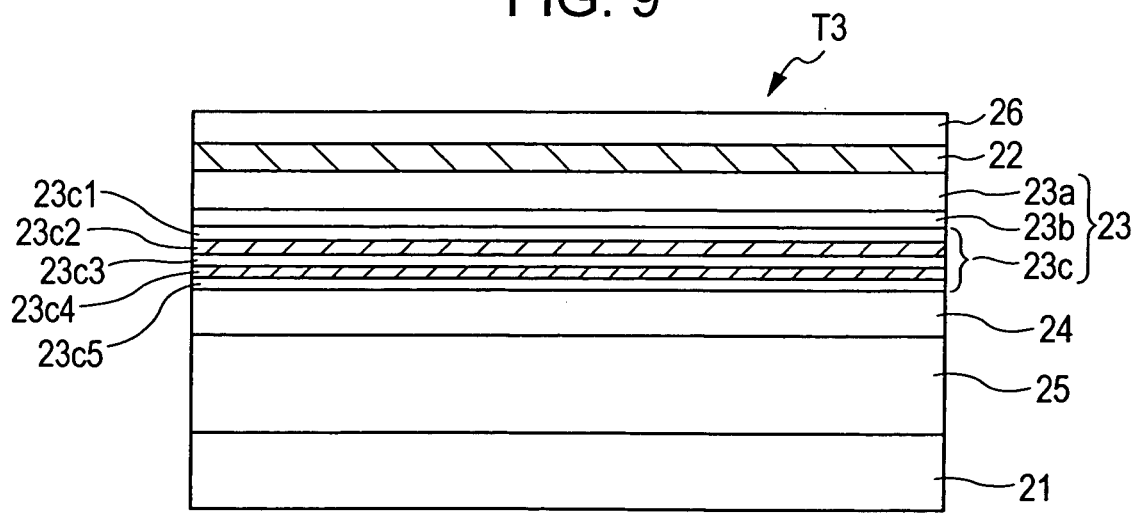
FIG. 9 is a partial schematic view of a magnetic sensing device according to a third embodiment of the present invention, viewed from a side facing a recording medium.

FIG. 9 is a schematic view of a structure of a multilayer material T3 different from that of the multilayer material T1 of the CPP-type magnetic sensing device shown in FIG. 1. As shown in FIG. 9, the multilayer material T3 is composed of a seed layer 21, a free magnetic layer 25, a nonmagnetic material layer 24, a pinned magnetic layer 23, a first magnetostriction-enhancing layer 22, and a protective layer 26 in this order from the bottom. The pinned magnetic layer 23 has an artificial ferri-structure including a composite composed of a second thin-film layer 23c, a nonmagnetic intermediate layer 23b, and a first thin-film layer 23a in this order from the bottom. In the multilayer material T3 shown in FIG. 9, the layers are laminated in reverse relation to those of the multilayer material T1 shown in FIG. 1. That is, the free magnetic layer 25 is disposed under the pinned magnetic layer 23.

The second thin-film layer 23c of the magnetic sensing device shown in FIG. 9 also has a composite structure composed of a plurality of magnetic layers 23c1, 23c3, and 23c5 and second magnetostriction-enhancing layers 23c2 and 23c4 disposed between each of these magnetic layers.

Both of the magnetic sensing devices shown in FIGS. 8 and 9 are a CPP-type and each have a bottom shielding layer 20 and a top shielding layer 30. These shielding layers also have a function as electrodes (see FIG. 1).

The first magnetostriction-enhancing layers and the second magnetostriction-enhancing layers are indicated by diagonal lines in FIGS. 8 and 9.

The multilayer materials T2 and T3 shown in FIGS. 8 and 9 also have a structure for increasing a magnetostriction constant of the pinned magnetic layer 23 (34) as a whole. That is, a magnetostriction constant of the first thin-film layer 23a (34a) is enhanced by disposing the first thin-film layer 23a (34a) to be contact with the first magnetostriction-enhancing layer 22 (35). Furthermore, a magnetostriction constant of the second thin-film layer 23c (34c) is enhanced by disposing the second magnetostriction-enhancing layers 23c2 (34c2) and 23c4 (34c4) within the second thin-film layer 23c (34c).

As described above, by disposing the second magnetostriction-enhancing layers 23c2 and 23c4 (34c2 and 34c4) within the second thin-film layer 23c (34c), magnetic coercive force of the second thin-film layer 23c (34c) can be increased by the effects of interface anisotropy and mutual diffusion at the interfaces.

As a result, magnetization of the pinned magnetic layer 23 (34) can be more effectively pinned in the height direction. Therefore, distortion and asymmetry of reproduced waveforms, caused by the disordered magnetization of the pinned magnetic layer 23 (34) by the longitudinal bias magnetic field from the hard bias layers, are decreased; inversion of the pinned magnetic layer 23 (34) caused by mechanical stress or the like can be prevented; and stable magnetization of the pinned magnetic layer 23 (34) can be also maintained regardless of a change in stress. Thus, the magnetic sensing device having a high reliability can be provided.

Materials used for the first magnetostriction-enhancing layers, the second magnetostriction-enhancing layers, and the pinned magnetic layers of the multilayer materials T2 and T3 and crystal orientation of these layers are the same as in the multilayer material T1 described with reference to FIG. 1.

Figure 11:
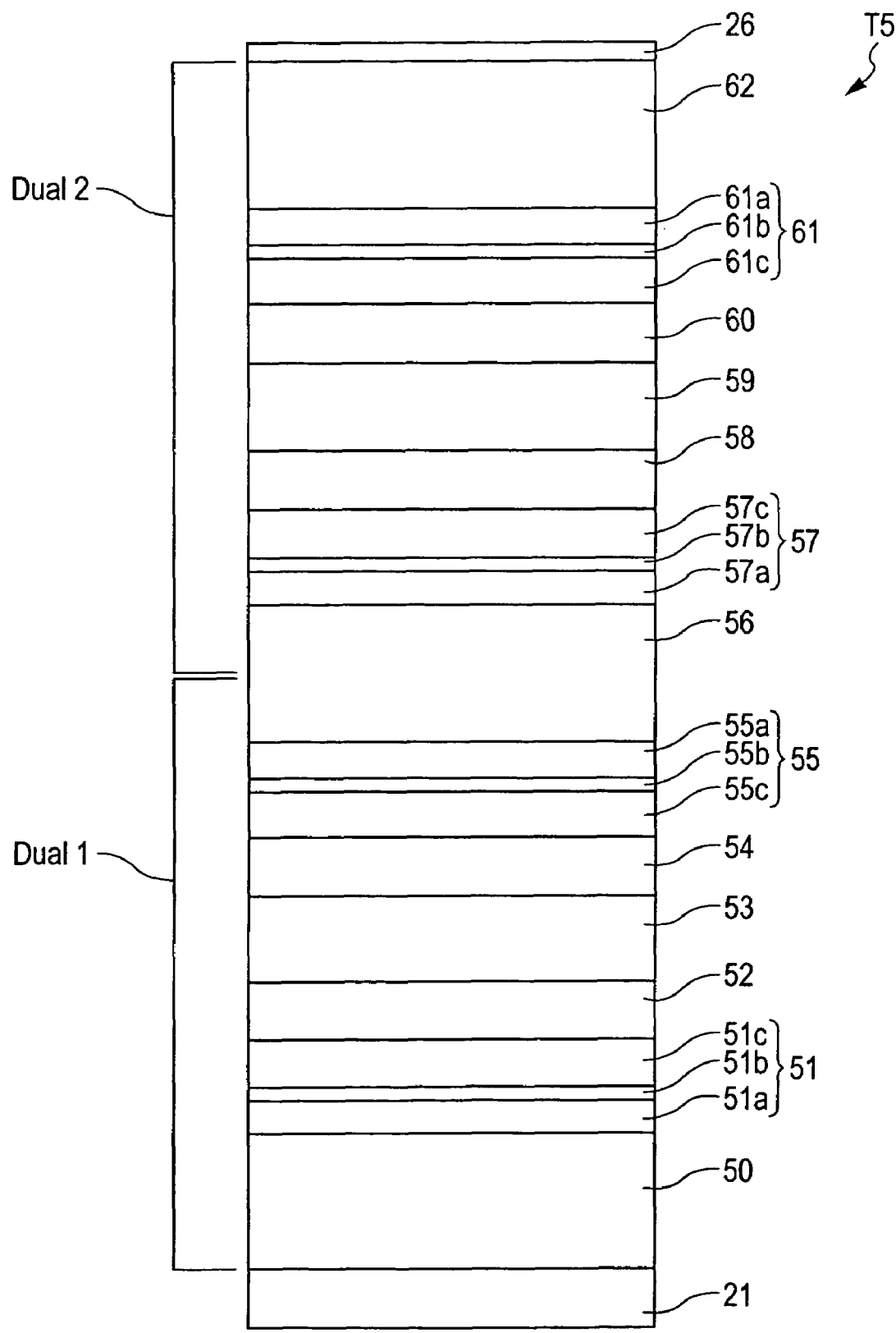
FIG. 11 is a partial schematic view of a comparative example to the magnetic sensing device shown in FIG. 10, viewed from a side facing a recording medium.
Figure 12:
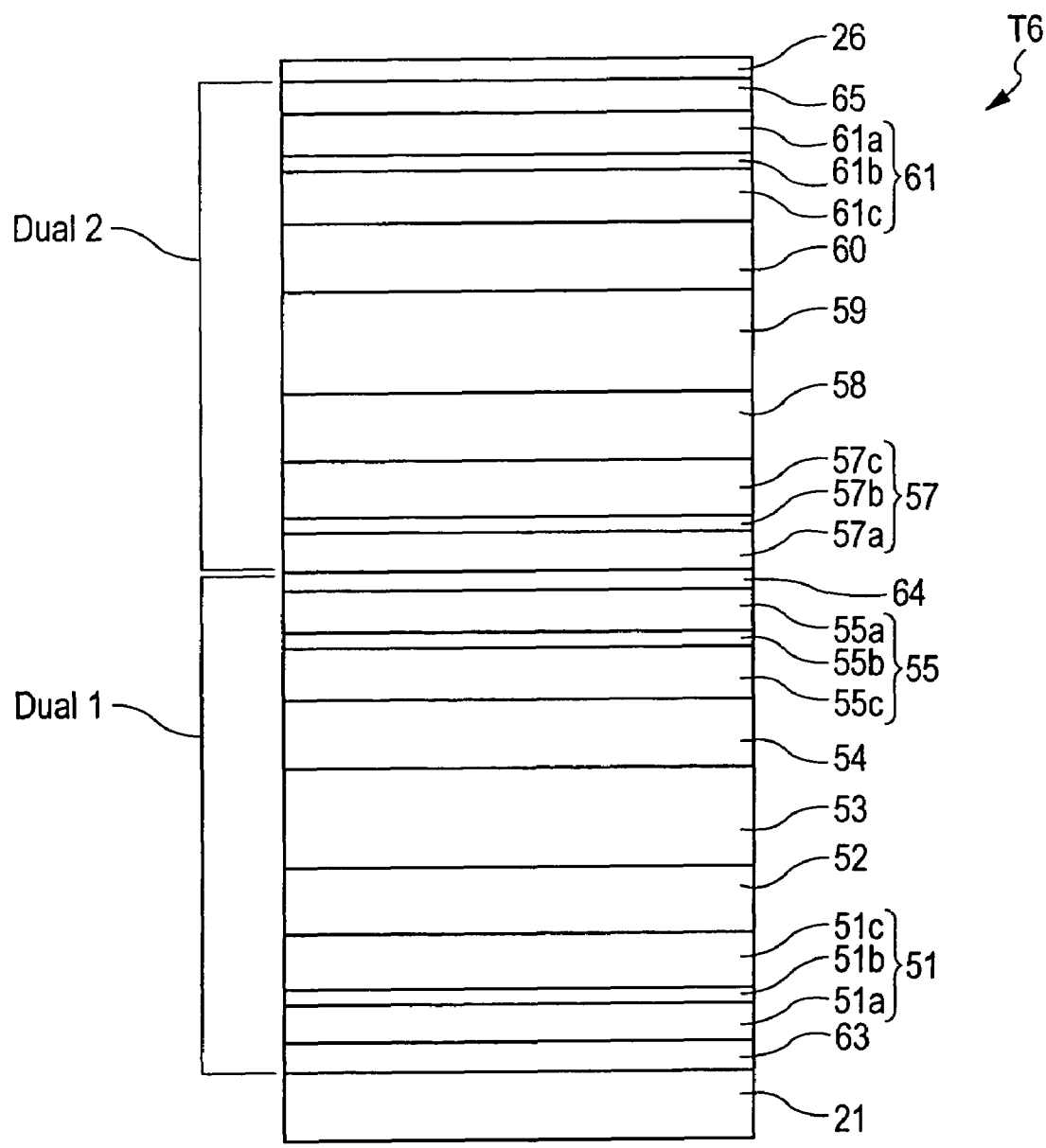
FIG. 12 is a partial schematic view of another comparative example to the magnetic sensing device shown in FIG. 10, viewed from a side facing a recording medium.
Figure 13:
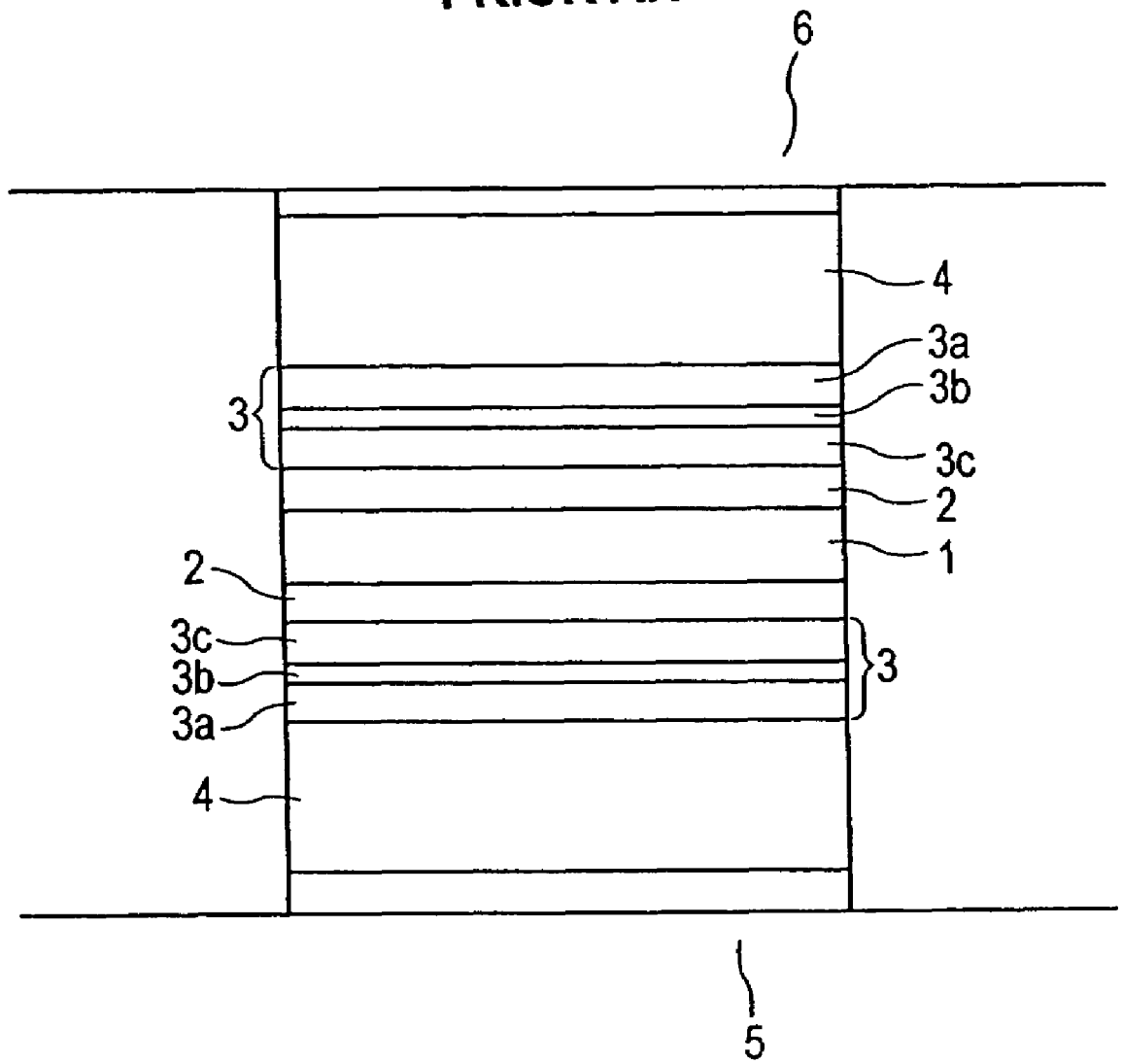
FIG. 13 is a partial schematic view of a conventional CPP-type magnetic sensing device, viewed from a side facing a recording medium.

Multilayer materials T5 and T6 shown in FIGS. 11 and 12, respectively, are comparative examples.

The multilayer material T5 has a composite structure composed of a seed layer 21, a first antiferromagnetic layer 50, a pinned magnetic layer 51, a nonmagnetic material layer 52, a free magnetic layer 53, a nonmagnetic material layer 54, a pinned magnetic layer 55, a second antiferromagnetic layer 56, a pinned magnetic layer 57, a nonmagnetic material layer 58, a free magnetic layer 59, a nonmagnetic material layer 60, a pinned magnetic layer 61, a third antiferromagnetic layer 62, and a protective layer 26 in this order from the bottom. All of four pinned magnetic layers have an artificial ferri-structure.

In the multilayer material T5 shown in FIG. 11, a composite structure including the layers from the first antiferromagnetic layer 50 disposed at the bottom of the multilayer material T5 to the second antiferromagnetic layer 56 placed at about the midpoint of the multilayer material T5 forms a first dual-spin-valve-type thin-film device (Dual 1) and a composite structure including the layers from the second antiferromagnetic layer 56 to the third antiferromagnetic layer 62 placed at the top of the multilayer material T5 forms a second dual-spin-valve-type thin-film device (Dual 2).

Namely, the multilayer material T5 shown in FIG. 11 has vertically superimposed dual spin-valve-type thin-film structures.

In a CPP-type magnetic sensing device mainly utilizing the spin-dependent bulk scattering effect, the GMR effect can be performed even if the device has the multilayer material T5 shown in FIG. 11. However, the device having the structure shown in FIG. 11 includes three thick antiferromagnetic layers 50, 56, and 62, and these layers have high resistivity to generate Joule heat. Therefore, lattice vibration and electromigration are caused by Joule heat; thus, the GMR effect and reproduced outputs cannot be sufficiently improved.

In the multilayer material T6 shown in FIG. 12, the antiferromagnetic layers 50, 56, and 62 of the multilayer material T5 shown in FIG. 11 are replaced with magnetostriction-enhancing layers 63, 64, and 65, respectively. The magnetostriction-enhancing layers 63, 64, and 65 are made of, for example, a Pt—Mn alloy. In the multilayer material T6 shown in FIG. 12, first thin-film layers 51a, 55a, 57a, and 61a constitute pinned magnetic layers 51, 55, 57, and 61 and are disposed farthest from nonmagnetic material layers 52, 54, 58, and 60 made of Cu; and the magnetostriction-enhancing layers 63, 64, and 65 are disposed to be in contact with the first thin-film layers 51a, 55a, 57a, and 61a, respectively. With such a structure, uniaxial anisotropy of the pinned magnetic layers 51, 55, 57, and 61 is increased by utilizing the reverse magnetostriction effect and magnetization of the pinned magnetic layers 51, 55, 57, and 61 is pinned by their uniaxial anisotropy.

In the multilayer material T6 shown in FIG. 12, the GMR effect and the reproduced outputs are improved compared to those in the multilayer material T5 shown in FIG. 11 by disposing the magnetostriction-enhancing layers 63, 64, and 65 having a small thickness instead of the antiferromagnetic layers 50, 56, and 62.

However, the magnetostriction-enhancing layer 64, which is located at about the midpoint of the multilayer material T6, must have a thickness enough to magnetically decouple the dual spin-valve structures (Dual 1 and Dual 2) from each other.

When the magnetostriction-enhancing layers 63, 64, and 65 are made of a material, such as a Pt—Mn alloy, having a relatively high resistivity, the magnetostriction-enhancing layers 63, 64, and 65 also generate heat. Since the magnetostriction-enhancing layer 64 is located at about the midpoint of the multilayer material T6 and is far from the electrodes on the top and bottom of the multilayer material T6, the heat generated by the magnetostriction-enhancing layer 64 is readily dissipated. Therefore, Joule heat from the magnetostriction-enhancing layer 64 causes lattice vibration and electromigration; thus, a decrease in the GMR effect and reproduced outputs is not properly resolved. In the structure shown in FIG. 12, a magnetostriction constant λs is properly increased only in the first thin-film layers 51a, 55a, 57a, and 61a in the magnetic layers constituting the pinned magnetic layers 51, 55, 57, and 61. Namely, a magnetostriction constant λs of second thin-film layer 51c, 55c, 57c, and 61c, which are in contact with nonmagnetic material layers 52, 54, 58, and 60 made of Cu, cannot be properly increased. Therefore, a structure that can increase the magnetostriction constant λs of the pinned magnetic layers 51, 55, 57, and 61 is desired.

Figure 10:
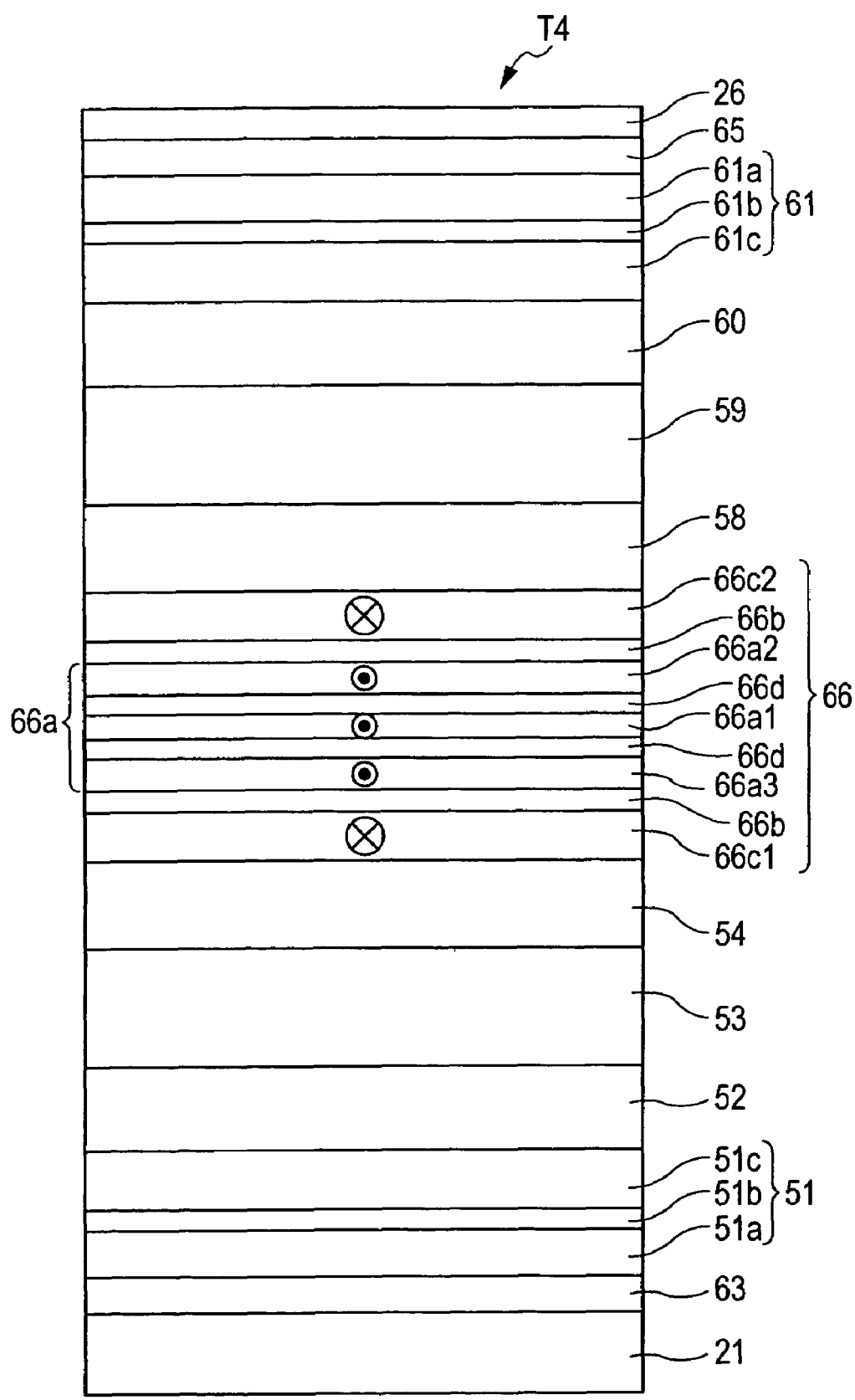
FIG. 10 is a partial schematic view of a magnetic sensing device according to a fourth embodiment of the present invention, viewed from a side facing a recording medium.

An embodiment shown in FIG. 10 is provided to respond such a requirement. FIG. 10 schematically shows a multilayer material T4 (a forth embodiment) having a structure different from that of the multilayer material T1 of the CPP-type magnetic sensing device shown in FIG. 1.

The multilayer material T4 shown in FIG. 10 has a pinned magnetic layer composed of nine layers at the midpoint. On the top and bottom of the pinned magnetic layer, nonmagnetic material layers, free magnetic layers, nonmagnetic material layers, pinned magnetic layers, and first magnetostriction-enhancing layers are disposed to constitute the multilayer material T4.

As shown in FIG. 10, a composite of the first magnetostriction-enhancing layer 63, the pinned magnetic layer 51, the nonmagnetic material layer 52, the free magnetic layer 53, and the nonmagnetic material layer 54 is disposed on a seed layer 21. The composite structure of these layers is the same as in FIG. 12.

In the multilayer material T6 shown in FIG. 12, two pinned magnetic layers 55 and 57 magnetically decoupled from each other by the first magnetostriction layer 64 are disposed on the nonmagnetic material layer 54. However, the multilayer material T4 shown in FIG. 10 has one pinned magnetic layer 66 having a multilayer structure disposed on the nonmagnetic material layer 54.

The pinned magnetic layer 66 includes a first thin-film layer 66a, nonmagnetic intermediate layers 66b, and second thin-film layers 66c1 and 66c2. The first thin-film layer 66a has a five-layer structure composed of three magnetic layers 66a1, 66a2, and 66a3, and two second magnetostriction-enhancing layers 66d disposed between each of the magnetic layers 66a1, 66a2, and 66a3. The magnetostriction-enhancing layers 66d are made of very thin films that cannot magnetically decouple the magnetic layers from each other, so that ferromagnetic coupling mediates between the magnetic layers. As a result, all of the magnetic layers 66a1, 66a2, and 66a3 are magnetized in the same direction and the resulting magnetization is pinned.

The nonmagnetic intermediate layers 66b made of Ru or the like are disposed on the top and bottom of the first thin-film layer 66a, and the second thin-film layers 66c2 and 66c1 are disposed on the top and bottom of the composite of the first thin-film layer 66a and the nonmagnetic intermediate layers 66b. Thus, the pinned magnetic layer 66 having a nine-layer composite structure as shown in FIG. 10 is formed.

In the multilayer material T4 as shown in FIG. 10, a composite composed of the free magnetic layer 59, the nonmagnetic material layer 60, the pinned magnetic layer 61, the first magnetostriction-enhancing layer 65, and a protective layer 26 in this order is disposed on the nonmagnetic material layer 58, as in the multilayer material T6 shown in FIG. 12.

In the multilayer material T6 shown in FIG. 12, two pinned magnetic layers 55 and 57 magnetically decoupled from each other are disposed at about the midpoint of the multilayer material T6. On the other hand, in the multilayer material T4 shown in FIG. 10, one pinned magnetic layer 66 instead of the pinned magnetic layers 55 and 57 is disposed at about the midpoint of the multilayer material T4. In the multilayer material T4, a magnetostriction constant λs of the first thin-film layer 66a constituting the pinned magnetic layer 66 can be increased by forming the first thin-film layer 66a with three magnetic layers and two thin magnetostriction-enhancing layers 66d disposed between each of the magnetic layers. Furthermore, in the multilayer material T4, the magnetostriction-enhancing layer 64 having a relatively large thickness for magnetic decoupling is not necessary, unlike the multilayer material T6 shown in FIG. 12.

Preferably, the second thin-film layers 51c, 66c1, 66c2, and 61c each include a composite structure composed of a plurality of magnetic layers and a second magnetostriction-enhancing layer disposed between each of the magnetic layers.

Since the structure shown in FIG. 10 is free from layers that generate heat, lattice vibration and electromigration caused by Joule heat can be prevented compared to the structure shown in FIG. 12. Therefore, a decrease in the GMR effect caused by the lattice vibration and electromigration is controlled to sufficiently magnetize and pin the pinned magnetic layer 66. Thus, the GMR effect and reproduced outputs can be stabilized and improved.

The present invention can be applied not only to the CPP-type magnetic sensing devices but also to the CIP-type magnetic sensing devices. In the present invention, the interface structure between the second thin-film layer and the nonmagnetic material layer is the same as that in known devices. Therefore, the pinned magnetic layer can be magnetized and the resulting magnetization is strongly pinned without a large decrease in a rate of resistance change (ΔR/R), even if the present invention is applied to the CIP-type magnetic sensing devices that the spin-dependent interface scattering effect is very important for the improvement in a rate of resistance change (ΔR/R).

What is claimed is:

1. A magnetic sensing device comprising a multilayer material having a pinned magnetic layer, a nonmagnetic material layer, and a free magnetic layer, wherein the pinned magnetic layer is a composite comprising a nonmagnetic intermediate layer and a plurality of magnetic thin-film layers disposed so as to be separated from each other by the nonmagnetic intermediate layer; wherein a first magnetostriction-enhancing layer made of a nonmagnetic metal is disposed on the pinned magnetic layer so as to be contact with a first thin-film layer placed farthest from the nonmagnetic material layer; wherein at least one of the magnetic thin-film layers has a composite structure comprising a second magnetostriction-enhancing layer made of a nonmagnetic metal and a plurality of magnetic layers disposed so as to be separated from each other by the second magnetostriction-enhancing layer; wherein all of the magnetic layers are magnetized in the same direction antiparallel to the adjacent magnetic thin-film layer separated by the nonmagnetic intermediate layer; wherein at least some crystals of the first magnetostriction-enhancing layer and the first thin-film layer are epitaxial or heteroepitaxial and at least some crystals of the second magnetostriction-enhancing layer and the magnetic layers are epitaxial or heteroepitaxial; and wherein the pinned magnetic layer has an open end face facing a recording medium.

2. The magnetic sensing device according to claim 1, wherein the magnetic thin-film layer having a composite structure comprising a second magnetostriction-enhancing layer and a plurality of magnetic layers disposed so as to be separated from each other by the second magnetostriction-enhancing layer is a second thin-film layer disposed closest to the nonmagnetic material layer.

3. The magnetic sensing device according to claim 2, wherein the magnetic layers constituting the second thin-film layer are made of a magnetic material having a positive coefficient of spin-dependent bulk scattering ($\beta$ value).

4. The magnetic sensing device according to claim 3, wherein at least one of the magnetic layers constituting the second thin-film layer is made of a Heusler alloy represented by a formula: $Co_2MnY$ (wherein Y is one or more elements selected from the group consisting of Al, Si, Ga, Ge, and Sn).

5. The magnetic sensing device according to claim 3, wherein at least one of the magnetic layers constituting the second thin-film layer is made of a magnetic material selected from the group consisting of Go, CoFe, Co-Z, CoFe-Z (wherein Z is one or more elements selected from the group consisting of Ti, Zr, Ta, Hf, Sc, V, Mn, Y, and Nb), and Ni-Q (wherein Q is one or more elements selected from the group consisting of Rh, Ir, Be, Al, Si, Ga, Ge, Ti, Mn, Zn, Cd, and Sn).

6. The magnetic sensing device according to claim 1, wherein current is applied to the multilayer material in the direction perpendicular to the film faces of the multilayer material.

7. The magnetic sensing device according to claim 6, wherein a coefficient of spin-dependent interface scattering ($\gamma$ value) of the interfaces between the second magnetostriction-enhancing layer and the magnetic layers is a positive value.

8. The magnetic sensing device according to claim 7, wherein the second magnetostriction-enhancing layer is made of one or more materials selected from the group consisting of Pt, Pd, Ag, Ir, and Rh.

9. The magnetic sensing device according to claim 1, wherein the second magnetostriction-enhancing layer has a thickness of 1 to 5 Å.

10. The magnetic sensing device according to claim 1, wherein the first magnetostriction-enhancing layer is made of an X—Mn alloy (wherein X is one or more elements selected from the group consisting of Pt, Pd, Ir, Rh, Ru, Os, Ni and Fe).

11. The magnetic sensing device according to claim 1, wherein the first magnetostriction-enhancing layer has a face-centered cubic (fcc) structure having a crystal plane (111) preferentially oriented in the direction parallel to the interface with the first thin-film layer at a region near the interface or the whole region, and the second magnetostriction-enhancing layer has a face-centered cubic (fcc) structure having a crystal plane (111) preferentially oriented in the direction parallel to the interfaces with the magnetic layers at regions near the interfaces or the whole regions.

12. The magnetic sensing device according to claim 1, wherein at least one of the first thin-film layer has a face-centered cubic (fcc) structure having a crystal plane (111) preferentially oriented in the direction parallel to the interface with the first magnetostriction-enhancing layer at a region near the interface or the whole region, or the magnetic layers have a face-centered cubic (fcc) structure having a crystal plane (111) preferentially oriented in the direction parallel to the interfaces with the second magnetostriction-enhancing layer at regions near the interfaces or the whole regions.

13. The magnetic sensing device according to claim 1, wherein at least one of the first thin-film layer has a body-centered cubic (bcc) lattice structure having a crystal plane (110) preferentially oriented in the direction parallel to the interface with the first magnetostriction-enhancing layer at a region near the interface or the whole region, or the magnetic layers have a body-centered cubic (bcc) lattice structure having a crystal plane (110) preferentially oriented in the direction parallel to the interfaces with the second magnetostriction-enhancing layer at regions near the interfaces or the whole regions.

* * * * *